(12) United States Patent
Macbeth et al.

(10) Patent No.: US 10,012,718 B2
(45) Date of Patent: *Jul. 3, 2018

(54) PROTECTIVE DEVICE WITH AUTOMATED SELF-TEST

(71) Applicant: Pass & Seymour, Inc., Syracuse, NY (US)

(72) Inventors: Bruce F. Macbeth, Syracuse, NY (US); David A. Finlay, Sr., Marietta, NY (US); Jeffrey C. Richards, Baldwinsville, NY (US)

(73) Assignee: PASS & SEYMOUR, INC., Syracuse, NY (US)

( * ) Notice: Subject to any disclaimer, the term of this patent is extended or adjusted under 35 U.S.C. 154(b) by 127 days.

This patent is subject to a terminal disclaimer.

(21) Appl. No.: 14/684,888

(22) Filed: Apr. 13, 2015

(65) Prior Publication Data

US 2015/0219740 A1    Aug. 6, 2015

Related U.S. Application Data

(63) Continuation of application No. 13/405,931, filed on Feb. 27, 2012, now Pat. No. 9,007,063, which is a (Continued)

(51) Int. Cl.
*G01R 35/00* (2006.01)
*G01R 31/14* (2006.01)
(Continued)

(52) U.S. Cl.
CPC ............. *G01R 35/00* (2013.01); *G01R 31/14* (2013.01); *G01R 31/28* (2013.01); (Continued)

(58) Field of Classification Search
CPC ................................ G01R 31/14; G01R 31/08
(Continued)

(56) References Cited

U.S. PATENT DOCUMENTS 3,930,187 A    12/1975    Misencik
4,019,120 A    4/1977    Fattic
(Continued)

FOREIGN PATENT DOCUMENTS

CA    2335895 A1    8/2001

*Primary Examiner* — Jeff Natalini
(74) *Attorney, Agent, or Firm* — Bond Schoeneck & King, PLLC; Frederick Price; George McGuire

(57) ABSTRACT

The present invention is directed to an electrical wiring device that includes a test circuit that is configured to generate a recurring simulated fault signal. A detection circuit is configured to generate a test detection signal in response to the recurring simulated fault signal. An end-of-life monitor circuit is configured to generate an end-of-life detection signal if the test detection signal is not generated within a first predetermined period of time. At least one indicator is configured to emit an indication signal in response to the end-of-life detection signal. A response mechanism is configured to decouple the plurality of line terminals from the plurality of load terminals after a second predetermined period of time has elapsed following the end-of-life detection signal.

26 Claims, 17 Drawing Sheets

Related U.S. Application Data continuation of application No. 12/955,581, filed on Nov. 29, 2010, now Pat. No. 8,125,228, which is a continuation of application No. 12/247,848, filed on Oct. 8, 2008, now Pat. No. 7,843,197, which is a continuation of application No. 11/025,509, filed on Dec. 29, 2004, now abandoned, which is a continuation-in-part of application No. 10/868,610, filed on Jun. 15, 2004, now Pat. No. 6,980,005, which is a continuation-in-part of application No. 10/668,654, filed on Sep. 23, 2003, now Pat. No. 6,873,158, which is a continuation of application No. 09/725,525, filed on Nov. 29, 2000, now Pat. No. 6,674,289.

(60) Provisional application No. 60/183,273, filed on Feb. 17, 2000.

(51) Int. Cl.
  *G01R 31/327* (2006.01)
  *G01R 31/28* (2006.01)
  *G01R 31/02* (2006.01)
  *H01H 73/04* (2006.01)
  *H01H 71/04* (2006.01)
  *H02H 3/33* (2006.01)

(52) U.S. Cl.
  CPC ..... *G01R 31/2829* (2013.01); *G01R 31/3277* (2013.01); *G01R 31/024* (2013.01); *H01H 73/045* (2013.01); *H01H 2071/044* (2013.01); *H02H 3/335* (2013.01)

(58) Field of Classification Search
  USPC .......................................................... 361/42
  See application file for complete search history.

(56) References Cited

U.S. PATENT DOCUMENTS

| | | |
|---|---|---|
| 4,672,501 A | 6/1987 | Bilac et al. |
| 4,742,422 A | 5/1988 | Tigges |
| 4,974,112 A | 11/1990 | Urich |
| 4,998,067 A | 3/1991 | Puckett et al. |
| 5,459,630 A | 10/1995 | MacKenzie et al. |
| 5,559,664 A | 9/1996 | Dogul et al. |
| 5,600,524 A | 2/1997 | Neiger et al. |
| 5,638,243 A | 6/1997 | Torezan |
| 5,715,125 A | 2/1998 | Neiger et al. |
| 5,754,963 A * | 5/1998 | Nunneley .......... G01R 31/2829 324/537 |
| 5,960,888 A | 10/1999 | Moore, Sr. |
| 6,040,967 A | 3/2000 | Disalvo |
| 6,052,265 A | 4/2000 | Zaretsky et al. |
| 6,111,733 A | 8/2000 | Neiger et al. |
| 6,262,871 B1 | 7/2001 | Nemir et al. |
| 6,313,642 B1 | 11/2001 | Brooks |
| 6,313,975 B1 | 11/2001 | Dunne et al. |
| 6,437,700 B1 | 8/2002 | Herzfeld et al. |
| 6,472,882 B1 | 10/2002 | Tiemann |
| 6,580,344 B2 | 6/2003 | Li |
| 6,611,406 B2 | 8/2003 | Neiger et al. |
| 6,674,289 B2 | 1/2004 | MacBeth |
| 6,697,237 B2 | 2/2004 | Duve |
| 6,804,904 B2 | 10/2004 | Garcia |
| 6,819,118 B2 * | 11/2004 | Kusuyama ............... G01D 5/16 324/609 |
| 6,873,158 B2 | 3/2005 | MacBeth |
| 6,980,005 B2 | 12/2005 | Finlay, Sr. |
| 6,984,988 B2 | 1/2006 | Yamamoto |
| 7,253,629 B1 | 8/2007 | Richards |
| 2001/0033468 A1 | 10/2001 | Macbeth |
| 2002/0135957 A1 | 9/2002 | Chan et al. |
| 2002/0181175 A1 | 12/2002 | Baldwin |
| 2003/0016477 A1 | 1/2003 | Li |
| 2003/0086220 A1 | 5/2003 | Nelson |
| 2004/0004795 A1 | 1/2004 | Chan et al. |
| 2005/0212522 A1 | 9/2005 | Finlay, Sr. et al. |

\* cited by examiner

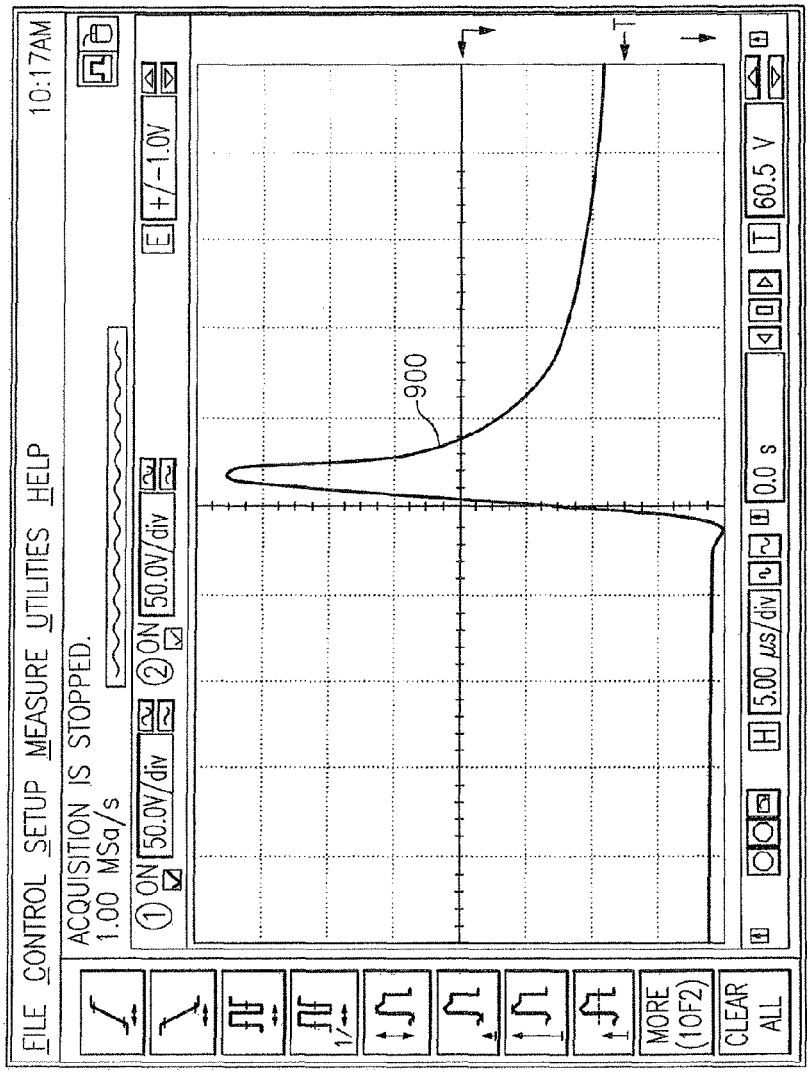
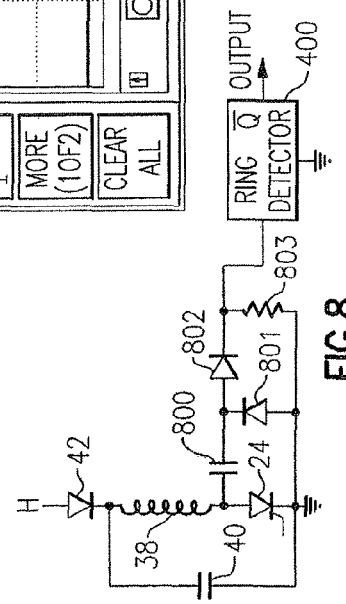
FIG.9
FIG.8

PROTECTIVE DEVICE WITH AUTOMATED SELF-TEST

CROSS-REFERENCE TO RELATED APPLICATIONS

This is a continuation of U.S. patent application Ser. No. 13/405,931 filed on Feb. 27, 2012, which is a continuation of U.S. patent application Ser. No. 12/955,581 filed on Nov. 29, 2010, which is a continuation of U.S. patent application Ser. No. 12/247,848 filed on Oct. 8, 2008, which is a continuation of U.S. patent application Ser. No. 11/025,509 filed on Dec. 29, 2004, now abandoned, which is a continuation-in-part of U.S. patent application Ser. No. 10/868,610 filed on Jun. 15, 2004, now U.S. Pat. No. 6,980,005, which is a continuation-in-part of U.S. patent application Ser. No. 10/668,654 filed on Sep. 23, 2003, now U.S. Pat. No. 6,873,158, the contents of which are relied upon and incorporated herein by reference in their entirety, and the benefit of priority under 35 U.S.C. § 120 is hereby claimed. U.S. patent application Ser. No. 10/668,654 claims priority under 35 U.S.C. § 120 based on U.S. Pat. No. 6,674,289, which was filed on Nov. 29, 2000, the contents of which are also relied upon and incorporated herein by reference in its entirety. U.S. Pat. No. 6,674,289 claims priority under 35 U.S.C. § 119(e) based on U.S. Provisional Patent Application Ser. No. 60/183,273, filed Feb. 17, 2000, the contents of which are relied upon and incorporated herein by reference in their entirety.

BACKGROUND OF THE INVENTION

1. Field of the Invention

The present invention relates generally to electric circuit protection devices, and particularly to protection devices with an end-of-life indicator.

2. Technical Background

Examples of electric circuit protection devices include ground fault circuit interrupters (GFCIs), arc fault circuit interrupters (AFCIs), or devices that include both GFCIs and AFCIs in one protective device. An electric circuit typically includes at least one protection device. Of course, an electric circuit is configured to transmit AC power from a breaker box to one or more load circuits disposed in the electric circuit. A load circuit may include any electrically powered device such as lighting devices, appliances, or other such devices.

The function of a protection device is to eliminate fault conditions that may result in shock or fire hazards. The most common fault conditions are ground faults and arc faults. Accordingly, a protection device must first detect a fault condition and then remove power to the load circuit in response thereto. Protection devices employ interrupting contacts that are opened to thereby break the connection between the protection device's line terminals and load terminals.

An arc fault is a discharge of electricity between two or more conductors. An arc fault may be caused by damaged insulation on the hot line conductor or neutral line conductor, or on both the hot line conductor and the neutral line conductor. The damaged insulation may cause a low power arc between the two conductors and a fire may result. Thus, an arc fault circuit interrupter (AFCI) protects the electric circuit in the event of an arc fault. An arc fault usually manifests itself as a high frequency current signal characterized by a "particular signature." In other words, an arc fault signal typically includes a concentration of energy in certain frequency bands. Accordingly, an AFCI may be configured to detect various high frequency signals, i.e., the signature, and de-energize the electrical circuit in response thereto.

A ground fault is a condition that occurs when a current carrying (hot) conductor contacts ground to create an unintended current path. The unintended current path represents an electrical shock hazard. A ground faults may also result in fire. A ground fault may occur for several reasons. If the wiring insulation within a load circuit becomes damaged, the hot conductor may contact ground, creating a shock hazard for a user. A ground fault may also occur when the equipment comes in contact with water. A ground fault may also be caused by damaged insulation within the facility.

A ground fault creates a differential current between the hot conductor and the neutral conductor. Under normal operating conditions, the current flowing in the hot conductor should equal the current in the neutral conductor. Thus, GFCIs typically compare the current in the hot conductor(s) to the return current in the neutral conductor by sensing the differential current between the two conductors. The GFCI may respond by actuating an alarm and/or interrupting the circuit. Circuit interruption is typically effected by opening the line between the source of power and the load.

A grounded neutral condition occurs when the load neutral terminal, or a conductor connected to the load neutral terminal, becomes grounded. This condition does not represent an immediate shock hazard. On the other hand, a grounded-neutral condition is an insidious double-fault condition that may lead to fatal consequences. Consider that a GFCI is configured to trip when the differential current is greater than or equal to approximately 6 mA. However, when the load neutral conductor is grounded the GFCI becomes de-sensitized because some of the return path current is diverted to ground. When this happens, it may take up to 30 mA of differential current before the GFCI trips. Thus, when both the hot conductor and the load neutral conductor are grounded, the GFCI may fail to trip, causing a user to experience serious injury or death.

Accordingly, it is desirable to provide a protection device that is capable of self-testing for all of the fault conditions described above. Further, a self-testing device is needed that detects the failure of certain components, such as the silicon controlled rectifier (SCR). If a failure mode is detected, the device is driven to a lock-out mode, such that power is permanently de-coupled from the load. A device is further needed that alerts the user to the end-of-life condition described immediately above. In other words, a device that includes an end-of-life indication before the device is driven into lock-out would be particularly advantageous.

SUMMARY OF THE INVENTION

The present invention addresses the needs described above. The present invention also provides several methods for detecting that an end-of-life condition has been reached. The protective device of the present invention also provides an advantageous indication that alerts the user to the fact that device failure has occurred. The device provides the user with a predetermined amount of time to replace the protective device before the device permanently denies power to the load terminals. The protective device permanently denies power to the load terminals after the predetermined amount of time has elapsed.

One aspect of the present invention is directed to an electrical wiring device that includes a plurality of line terminals and a plurality of load terminals. A test circuit is coupled to the line terminals or the load terminals and configured to generate a recurring simulated fault signal. A detection circuit is coupled to the test circuit, the detection circuit being configured to generate a test detection signal in response to the recurring simulated fault signal. An end-of-life monitor circuit is coupled to the detection circuit, the end-of-life monitor circuit being configured to generate an end-of-life detection signal if the test detection signal is not generated within a first predetermined period of time. At least one indicator is coupled to the end-of-life monitor circuit, the at least one indicator being configured to emit an indication signal in response to the end-of-life detection signal. A response mechanism is coupled to the end-of-life monitor circuit; the response mechanism being configured to decouple the plurality of line terminals from the plurality of load terminals after a second predetermined period of time has elapsed following the end-of-life detection signal.

Another aspect of the present invention is directed to a method for operating an electrical wiring device that includes a plurality of load terminals. The method includes generating a recurring simulated fault signal. A test acceptance signal is generated in response to the recurring simulated fault signal. An end-of-life detection signal is generated if the test acceptance signal is not generated within a first predetermined period of time. An indication signal is emitted in response to the end-of-life detection signal. The plurality of load terminals are decoupled from AC power after a second predetermined period of time has elapsed following the end-of-life detection signal.

The present invention provides a variety of methods for indicating that an end-of-life, or device failure, has occurred. In one embodiment, the indicator is actuated automatically by a self-test mechanism that automatically identifies an end-of-life condition. In another method provided by the present invention, the end-of-life condition is detected by manually depressing a test button. The test button initiates a test procedure. If the protective device fails to generate a test acceptance signal in response to the test procedure, the indicator is energized. In another embodiment, the end-of-life/device failure indication procedure may include tripping the protective device in the event that the end-of-life test acceptance signal is not generated by the device. While the user may be able to reset the protective device to restore power to the load terminals, the protective device permanently denies power to the load terminals after a predetermined period of time has elapsed.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention and together with the description serve to explain the principles and operation of the invention.

BRIEF DESCRIPTION OF THE DRAWINGS

FIG. 8 is a schematic showing a GFI output circuit in accordance with yet another embodiment of the present invention;

FIG. 9 is a chart showing the typical output voltage of the GFI output circuit depicted in FIG. 8;

DETAILED DESCRIPTION

Figure 1:
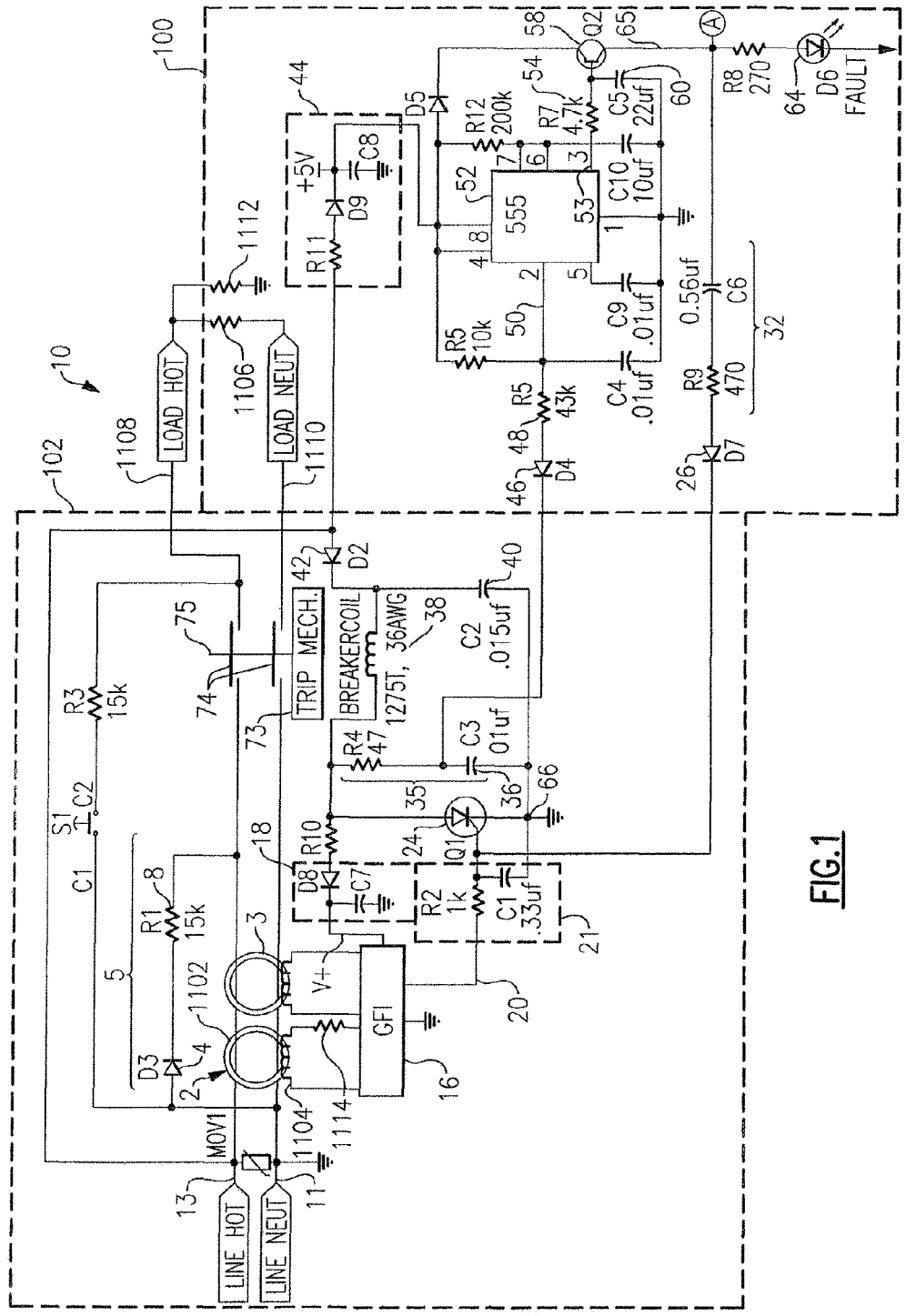
FIG. 1 is a schematic of a circuit protection device in accordance with one embodiment of the present invention.

Reference will now be made in detail to the present exemplary embodiments of the invention, examples of which are illustrated in the accompanying drawings. Wherever possible, the same reference numbers will be used throughout the drawings to refer to the same or like parts. An exemplary embodiment of the protection device of the present invention is shown in FIG. 1, and is designated generally throughout by reference numeral 10.

As embodied herein, and depicted in FIG. 1, a schematic of a circuit protection device 10 in accordance with one embodiment of the present invention is disclosed. In particular, FIG. 1 is an illustration of a GFCI 10 which self checks for ground fault detection every negative half cycle during the period when an electronic switch such as an SCR 24 cannot conduct. If the self test fails, GFCI 10 is tripped out on the subsequent positive half cycle. GFCI 10 includes a GFI circuit 102 and a self test checking circuit 100. GFI circuit 102 includes a standard GFCI device in which a load-side ground fault is sensed by a differential transformer 2. A transformer 3, which is a grounded neutral transmitter, is used to sense grounded neutral faults. The transformer 2 output is processed by a GFI detector circuit 16 which produces a signal on output 20 that, after filtering in a circuit 21, activates a trip SCR 24. When SCR 24 turns ON, it activates a solenoid 38 which in turn operates a mouse trap device 73, releasing a plurality of contacts 74 and interrupting the load.

A power supply 18 provides power for GFI detector circuit 16 for full cycle operation. A negative cycle bypass circuit 5, which preferably includes a diode 4 in series with a resistor 8, introduces a bypass current, simulating a ground fault, between neutral and hot lines 11, 13 during the negative half cycle of the AC power. The same bypass current could also be produced by placing bypass circuit 5 between lines 11 and 13 with the diode 4 anode at neutral line 11.

The GFI 102 output circuit is formed by placing capacitor 40 in series with solenoid 38 to thereby form a resonating tank circuit. The tank circuit is placed in parallel with SCR 24 and a snubber circuit 35. Capacitor 40 charges on the positive half cycle of the AC power, but is prevented from discharging on the negative half cycle of the AC power by a blocking diode 42.

An across-the-line metal oxide varistor (MOV1), also commonly referred to as a movistor, may be included in the protective device such as MOV 15 to prevent damage of the protective device from high voltage surges from the AC power source. The movistor is typically 12 mm in size.

Figure 2:
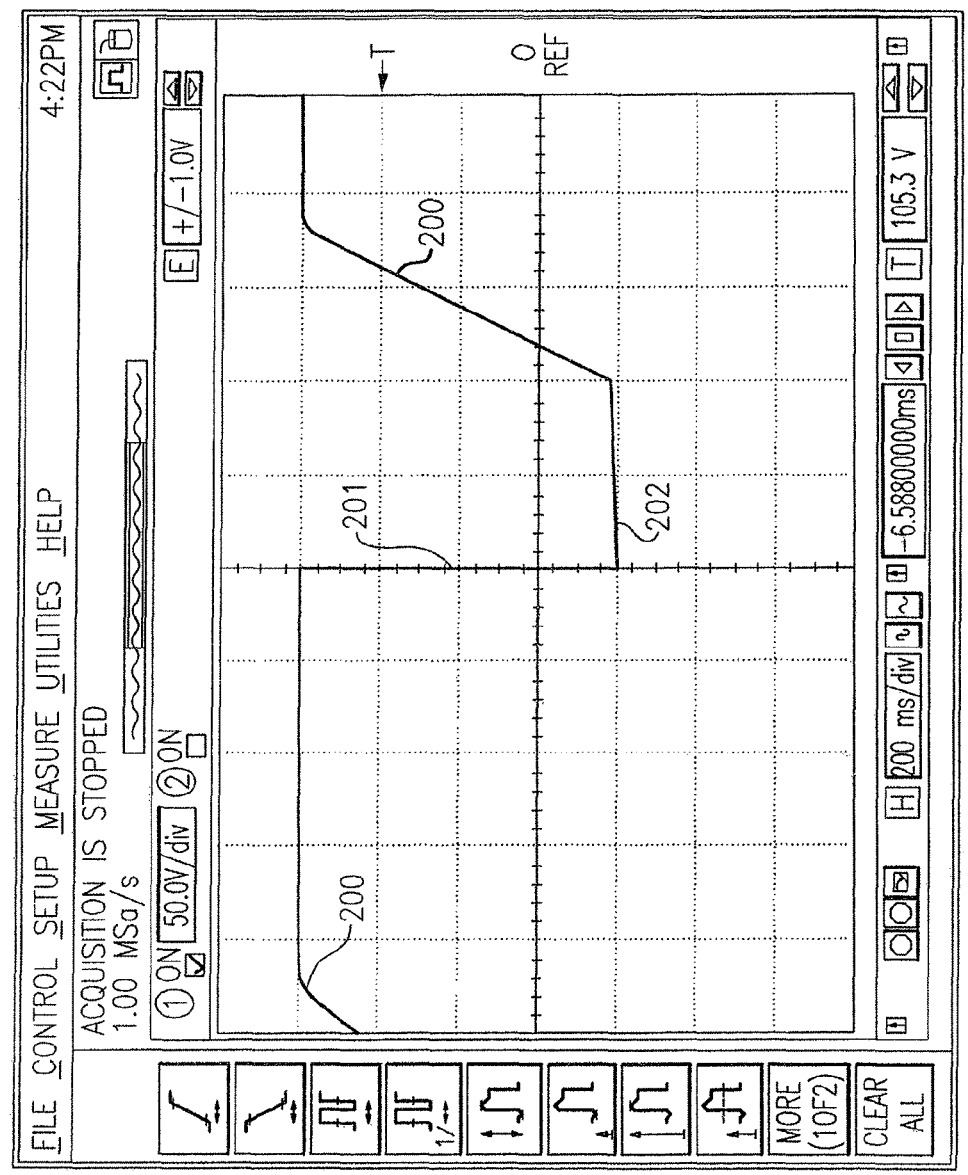
FIG. 2 is a chart showing the ground fault interrupter (GFI) circuit output voltage under normal conditions.

Referring to FIG. 2, a chart showing the ground fault interrupter (GFI) circuit output voltage under normal operating conditions is disclosed. Accordingly, capacitor 40 is charged to the peak of the AC wave as shown at point 200. On each negative portion of the AC wave, when SCR 24 cannot conduct line current, bypass 5 introduces a simulated ground fault which is sensed by transformers 2 and detected by GFI detector circuit 16, thereby activating SCR 24. Activation of SCR 24 discharges capacitor 40 through solenoid 38 and SCR 24 as shown at point 201. Capacitor 40 and solenoid 38 form a resonant circuit. When SCR 24 discharges capacitor 40 during the negative AC power cycle, a field is built up around solenoid 38 which, when collapsing, causes a recharge of capacitor 40 in the opposite direction, thereby producing a negative voltage across the capacitor when referenced to circuit common. When the SCR current falls below the minimum holding current, SCR 24 switches OFF, so that the negative charge remains on capacitor 40 until the next positive AC cycle. At that time, the current flowing through diode 42 charges capacitor 40 in the positive voltage direction. The negative voltage across capacitor 40 also appears across capacitor 36 of snubber circuit 35 as shown at point 202.

Figure 3:
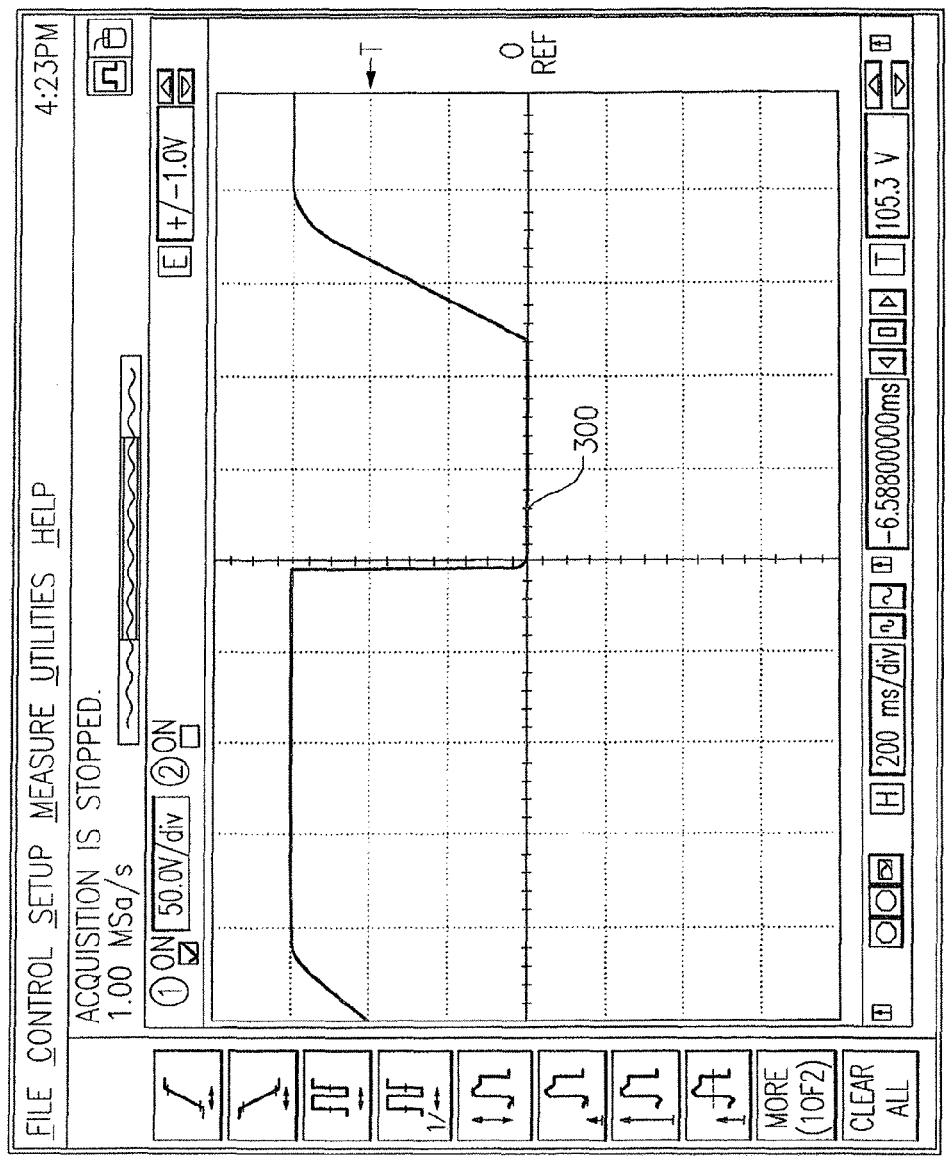
FIG. 3 is a chart showing the GFI circuit output voltage under an internal fault condition.

Referring to FIG. 3, a chart showing the GFI circuit output voltage under an internal fault condition is shown. For example, the negative voltage across capacitor 40 does not appear if solenoid 38 is shorted because no solenoid magnetic field exists to collapse and produce the negative voltage. Thus, if any of the components including differential transformer 2, GFI detector circuit 16, circuit 21, power supply 18, SCR 24, solenoid 38, capacitor 40, and blocking diode 42 of circuit 102 fail, capacitor 40 does not discharge through solenoid 38, and the negative voltage across capacitor 40 from the collapsing field of solenoid 38 does not appear.

Referring back to FIG. 1, checking circuit 100 is a stand-alone circuit preferably with its own power supply 44 providing power to a timer 52. Timer 52 is shown here as a 555 timer, but other timers known to those skilled in the art can be used. When the negative voltage appears across capacitor 40 and therefore across capacitor 36 as described above, a diode 46 conducts, pulling an input 50 of timer 52 LOW, triggering timer 52 into a monostable timeout mode. An output 53 of timer 52 goes HIGH, keeping a transistor 58 turned OFF. The timeout of timer 52 is long enough for timer 52 to be repeatedly re-triggered by the negative cycle discharge of capacitor 40 so that timer 52 does not time out. Thus, output 53 stays HIGH keeping transistor 58 OFF. An optional integrator formed by a resistor 54 and a capacitor 60 acts to hold transistor 58 OFF during any brief transitions when timer 52 times out just before timer 52 is re-triggered.

If GFI circuit 102 fails to discharge capacitor 40 to a negative voltage, then timer 52 is not re-triggered, causing output 53 to go LOW and turning transistor 58 ON. Turning transistor 58 ON preferably activates a fault lamp 64 thereby indicating a failure of GFCI circuit 102. Turning transistor 58 ON sends a signal through a differentiator 32 and blocking diode 26 to trigger SCR 24. Differentiator 32 sends a one-shot pulse to SCR 24 which lasts long enough to overlap into a positive AC cycle, so that triggering SCR 24 activates mouse trap device 73, trips contacts 74, and disables GFCI 10. Optional outcomes of a failure in GFCI 10 are locking out power, indicating the failure on a lamp, or both.

Figure 4:
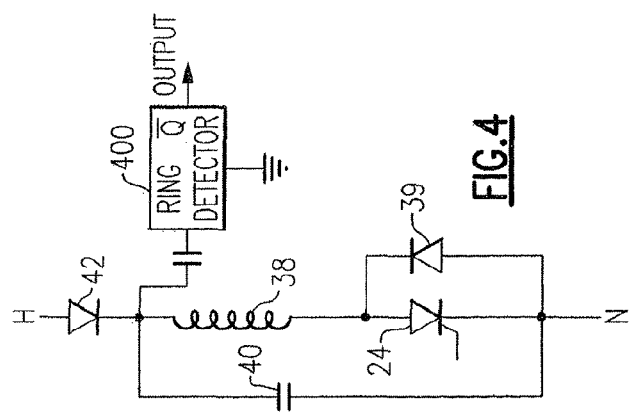
FIG. 4 is a schematic showing a GFI output circuit in accordance with another embodiment of the present invention.

As embodied herein and depicted in FIG. 4, a schematic showing a GFI output circuit in accordance with another embodiment of the present invention is disclosed. In this alternate embodiment, diode 39 replaces the snubber circuit 35 shown in FIG. 1. Diode 39 provides a bypass of SCR 24 and allows the ring to continue as energy moves back and forth between solenoid 38 and capacitor 40.

Figure 5:
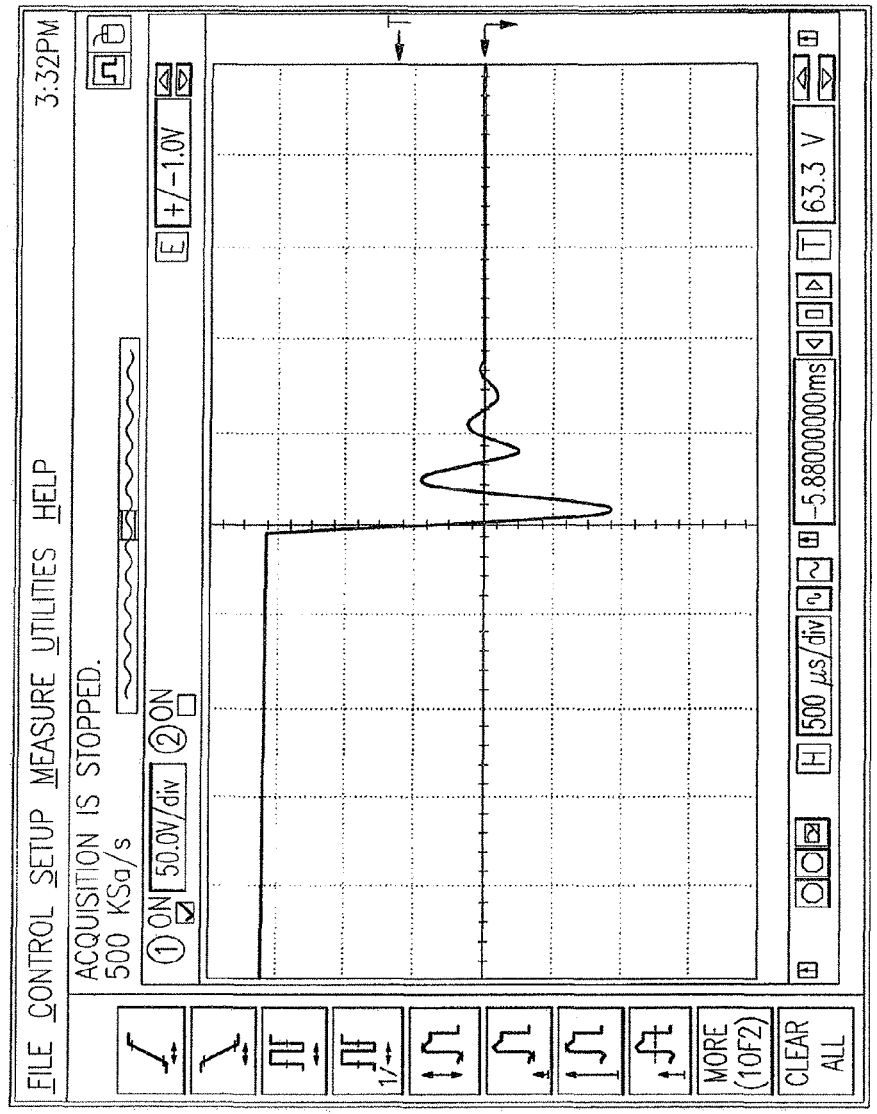
FIG. 5 is a chart showing the output voltage of the GFI output circuit depicted in FIG. 4 under normal conditions.

Referring to FIG. 5, the voltage waveform of the GFI output circuit depicted in FIG. 4 is shown. In particular, FIG. 5 shows the voltage ring across capacitor 40. Ring detector block 400 monitors the output voltage. Ring detector block 400 is performs a function similar to the one performed by checking circuit 100 shown in FIG. 1. The absence of a proper output ring voltage fails to reset the timer in circuit 400. Accordingly, the timer in circuit 400 will time out, indicating a failure of the GFI circuit 102. It will be apparent to those of ordinary skill in the pertinent art that modifications and variations can be made to ring detector block 400 of the present invention depending on the variations of the GFI output circuit and their resultant waveforms.

Figure 6:
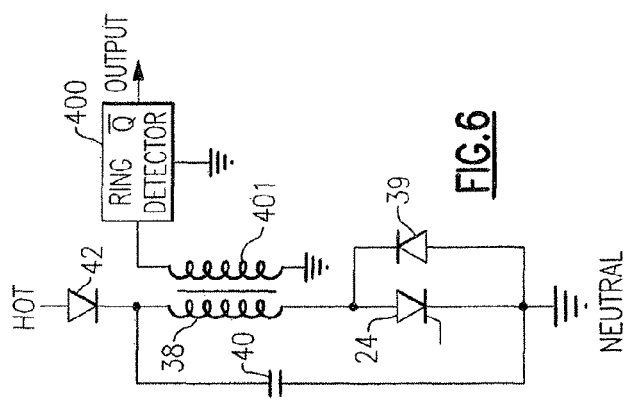
FIG. 6 is a schematic showing a GFI output circuit in accordance with yet another embodiment of the present invention.

As embodied herein and depicted in FIG. 6, a schematic showing a GFI output circuit in accordance with another embodiment of the present invention is disclosed. In this alternate embodiment, a secondary 401 intercepts the magnetic field from solenoid 38.

Figure 7:
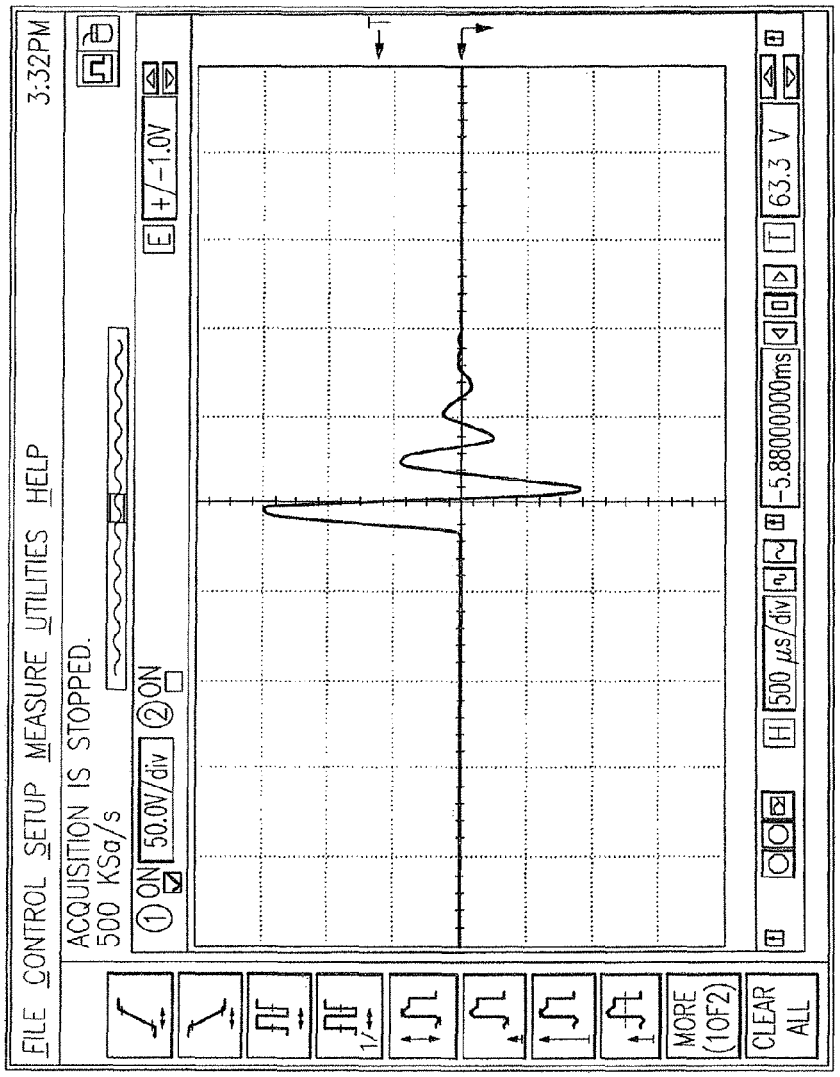
FIG. 7 is a chart showing the typical output voltage of the GFI output circuit depicted in FIG. 6.

Referring to FIG. 7, the output voltage waveform of the GFI output circuit depicted in FIG. 6 is shown. Detector circuit 400 detects the ring and issues an output if the ring fails due to circuit failure.

Figure 10:
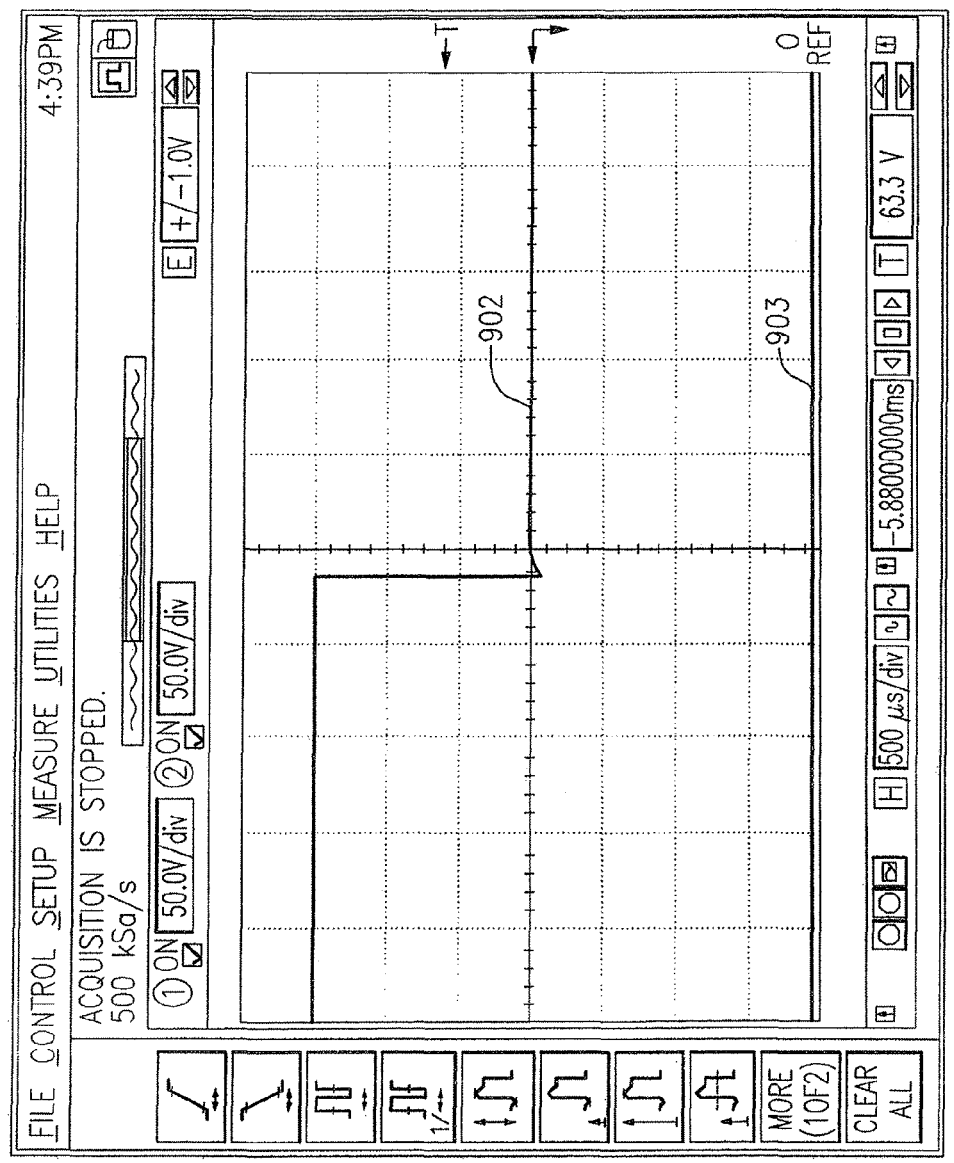
FIG. 10 is a chart showing the typical output voltage of the GFI output circuit depicted in FIG. 8 under a fault condition.

As embodied herein and depicted in FIG. 8, a schematic showing a GFI output circuit in accordance with yet another embodiment of the present invention is disclosed. Referring to FIGS. 8-10, another embodiment is shown for obtaining the ringing waveform. If the protective device is operational, SCR 24 turns on during the negative half cycles, causing capacitor 40 to discharge through solenoid 38. When the current through solenoid 38 starts to reverse in order to return stored energy to capacitor 40, SCR 24 turns off and the reverse current flows through diode 801, charging capacitor 800. There is a succession of ringing periods during the negative half cycle of the AC power source in which energy is transferred from capacitor 40 to solenoid 38 and back again. Each time the energy is transferred to solenoid 38, SCR 24 turns on. When SCR 24 is ON, the voltage across capacitor 800 forward biases diode 802 to produce a signal at the input of ring detector 400, shown in FIG. 9 as positive pulse 900. Ring detector 400 produces an output signal upon detection of a predetermined number of one or more positive pulses, indicative of ringing.

FIG. 10 shows a GFI output circuit voltage waveform during a fault condition. In particular, FIG. 10 illustrates the circuit response when solenoid 38 is shorted. Waveform 902 is the voltage across the switching terminals of SCR 24. Waveform 903 is the waveform at the input of ring detector 400. When solenoid 38 is shorted, indicating a failed solenoid, SCR 24 conducts as before during the negative half cycle of the power source. Since diode 42 is non-conductive during the negative half cycle, SCR 24 discharges capacitor 40. Since solenoid 38 is shorted, it has little or no inductance. Thus capacitor 40 discharges as before, but due to lack of inductance there is no reverse current through diode 801 to produce a charge of the correct polarity on capacitor 800. Accordingly, capacitor 800 is unable to discharge a positive pulse through diode 802. Without the positive pulse, the timer in detector 400 is not reset before time out occurs. In response, ring detector 400 transmits an output signal and device 10 is tripped. Furthermore, failure of other components may be configured to prevent a ringing signal, including opening or shorting of solenoid 38, capacitor 40, capacitor 800 or diode 801.

It will be understood by those of ordinary skill in the art that although the circuit examples so far described perform a self test for correct circuit operation during the negative power cycle, i.e., when the SCR of the disclosed embodiments is inactive as far as carrying line current, the circuit reference and SCR orientation could be reversed so as to become non-conducting during the positive line cycle. Thus, the present invention is equally applicable to positive half-cycle testing. Further, in another embodiment, SCR 24 is replaced by another unipolar conducting device, such as a transistor or field effect transistor (FET), and placed in series with a blocking diode. Those of ordinary skill in the art will also recognize that circuits described herein may be adapted for use in a GFEP (ground fault equipment protector) or AFCI (arc fault interrupter circuit), as well as in a GFCI. Furthermore, although the GFCI is described herein as being connected to the hot and neutral lines, the present invention could be connected between any two lines, whether hot or neutral, multiple phase systems and multiple phase systems do not have a neutral conductor, by changing component values as appropriate.

As described above, the self-test signal is confined to either the negative half cycle or the positive half cycle of the AC power depending on whether negative half cycle or positive half cycle testing is employed. However, there are circumstances in which the self-test simulation signal is confined to a negative half cycle but the resulting self-test signal extends into one or more of the following cycles of AC power, including one or more positive half cycle. This phenomenon may have several deleterious effects. The presence of an extended signal in the positive half cycle may cause the protective device to false trip. Further, an extended signal may interfere with a true fault signal that device 10 is configured to detect during the positive half cycle. In other words, the interference of the extended signal affects the sensitivity of the device. Thus, the extended signal may result in device unresponsiveness or device false tripping, depending on whether the extended signal opposes or aids the true fault signal.

Referring again to FIG. 1, one possible cause of signal extension relates to the characteristics of transformer 2. As shown, transformer 2 includes a toroidal core 1102 through which neutral and hot lines 11 and 13 are passed to form primary windings. A secondary winding, 1104, is wound about the toroid. Toroidal core 1102 may be implemented using a magnetic material, having a predetermined permeability. As those of ordinary skill in the art understand, if there is a load 1106 coupled to hot and neutral load terminals 1108 and 1110, the currents through hot line 13 and neutral line 11 are equal and opposite, producing equal and opposite signals in the two primary windings. As a result, there should be no magnetic flux in core 1102 and, therefore, no output signal on winding 1104. However, if there is a load-side ground fault 1112 coupled to load hot terminal 1108, a true ground fault current flows through hot line 13 that does not flow through neutral line 11. A difference current between the two primary windings is generated. The difference current generates a magnetic flux in toroidal core 1102 and a sensor output signal is provided to GFI detector 16 by way of resistor 1114 which is coupled to winding 1104. Resistor 1114 is typically referred to as the "burden resistance" on winding 1104. The relationship between the burden resistance and the core permeability is discussed in the following paragraph.

Those of ordinary skill in the art recognize that it is desirable to operate transformer 2 in a current transformer mode. Current transformer mode operation is advantageous because the output signal from winding 1104 is substantially independent of the permeability of core 1102. This is important because the permeability value of the core is difficult to accurately manufacture. The inductance of winding 1104 is typically 10 Henries. The corresponding inductive reactance is about 3,600 Ohms if the frequency of the AC power, i.e., the frequency of the fault current, is 60 Hz. The burden resistance is typically chosen to be about a tenth of the inductive reactance of winding 1104 at the frequency of the AC power, if transformer 2 is to operate in a current transformer mode. Therefore, there are constraints of the value of secondary winding inductance and burdening resistance (or impedance) for the proper operation of the GFI. As noted above, the self-test flux residue causes self test signal extension into a positive half cycle. The secondary winding inductance (L) and the burden resistance (R) establish a rate of decay of the extended test signal.

Accordingly, there is an optimal L/R time constant for the given AC power frequency, wherein L is the secondary winding inductance and R is the burden resistance on the winding. The flux that is induced by the negative half cycle self-test signal decays at a rate established by the L/R time constant. If the AC power frequency is 60 Hz, for example, the L/R time constant is typically chosen to be 15 to 30 milliseconds, as compared to the 16.6 mS period (60 Hz) of the power frequency. Although the values are described for a 60 Hz power distribution system, similar considerations apply to other frequencies that are in use, such as 50 Hz and 400 Hz. Thus, the flux residue from the negative half cycle self test interferes with the flux induced by a true ground fault for multiple AC power periods (16.6 mS per period), adversely affecting true fault current detection.

Another cause for an extended test signal is the delay time associated with filter circuit 21. Filter circuit 21 is typically a low pass filter configured to reject high frequency noise.

Figure 11:
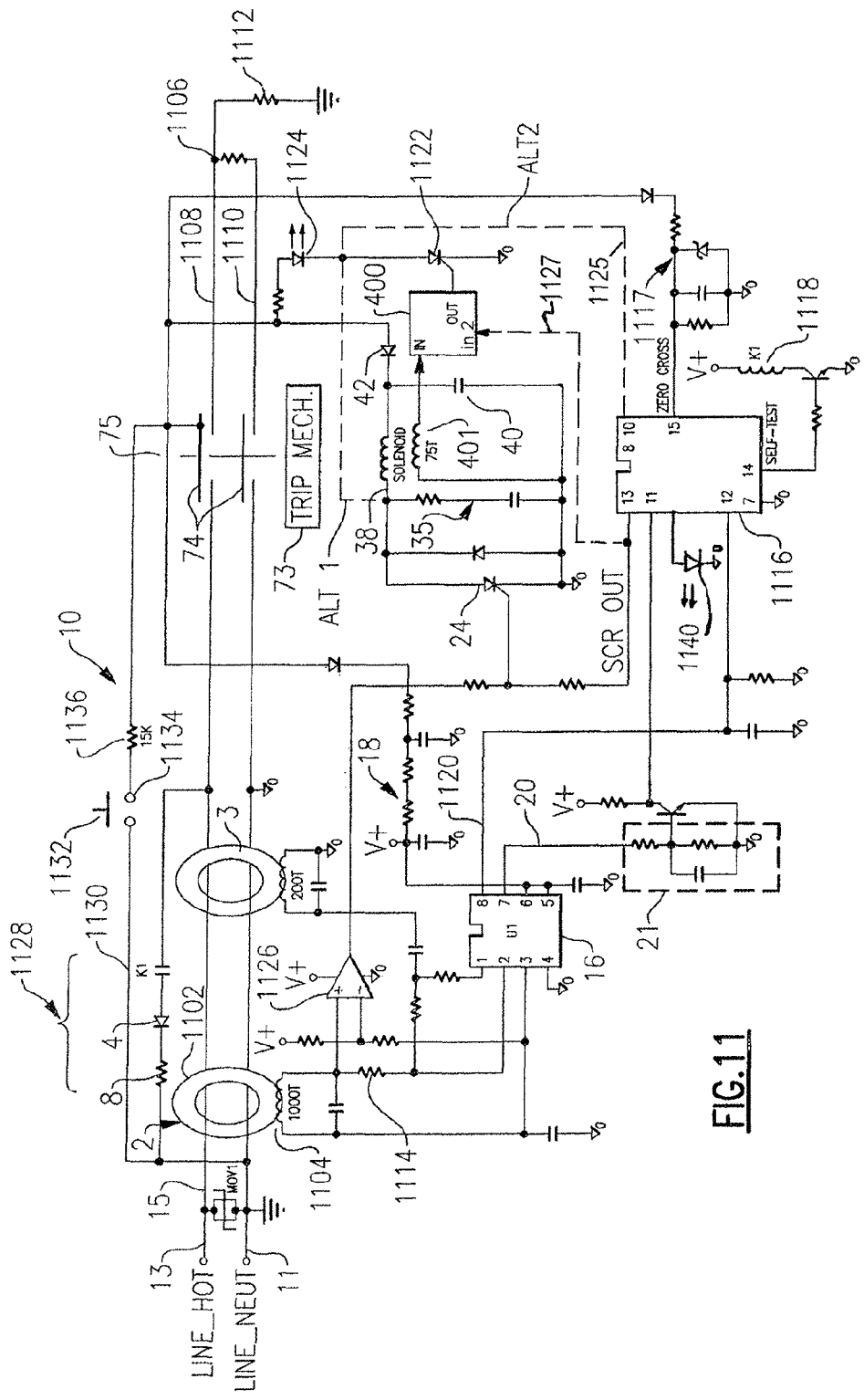
FIG. 11 is a schematic of a circuit protection device in accordance with a second embodiment of the present invention.

As embodied herein, and depicted in FIG. 11, a schematic of a circuit protection device 10 in accordance with one embodiment of the present invention is disclosed. GFCI 10 includes ground fault interrupter circuitry and automated self-test circuitry. An across-the-line metal oxide varistor 15 (movistor 15) may be provided to prevent damage to device 10 from high voltage surges propagating on the line conductors 11, 13. Movistor 15 is typically 12 mm in size.

The ground fault circuitry includes a differential transformer 2 which is configured to sense load-side ground faults. Transformer 3 is configured as a grounded neutral transmitter and is employed to sense grounded-neutral fault conditions. Both differential transformer 2 and grounded-neutral transformer 3 are coupled to detector circuit 16. Power supply 18 provides power for GFI detector circuit 16 for full cycle operation. Detector circuit 16 processes the transformer outputs. Detector 16 provides an output signal on output pin 20 based on the transformer outputs. As shown in FIG. 11, the detector output signal is filtered by circuit 21. Control gate 1116 is coupled to detector 16 and is configured to receive either detector output signal 1120 or filtered detector output signal 20. These signals are directed into control gate 1116 respectively by way of pin 12 or pin 11. Control gate 1116 directs, in turn, both of these signals into a gate circuit to thereby provide SCR 24 with a delayed output signal (SCR Out). Notice also that the output of by-pass circuit 1126 is likewise provided to SCR 24. Accordingly, SCR 24 may be turned ON by either a detector 16 output or by a by-pass circuit 1126 output. SCR 24 is configured to energize solenoid 38 when it is turned ON. Solenoid 38 drives trip mechanism 73 to break the circuit. When either of these signals is transmitted to SCR 24 during the negative half-cycle, SCR 24 is unable to energize solenoid 38. However, the application of either or both of these signals to SCR 24 does provide a test acceptance signal to the input of checking circuit 400.

Device 10 also includes a by-pass circuit 1126 that is coupled to sensor 2. By-pass circuit 1126 represents an important safety feature that is activated when the differential current exceeds a predetermined amount. Note that the output of by-pass 1126 is directly connected to SCR 24. Thus, when the differential current exceeds the predetermined current, control gate 1116 is by-passed and SCR 24 is actuated and device 10 is tripped. The rationale for by-pass circuit 1126 is discussed below in greater detail. Suffice it to say that in some cases it is not prudent to provide the user with a delay before tripping the device.

GFCI 10 also includes a GFI output circuit 350 formed by coupling capacitor 40 with solenoid 38. GFI output circuit 350 links detector 16 with end-of-life monitor circuit 400 and control gate 1116. Capacitor 40 and solenoid 38 form a resonating tank circuit. The tank circuit is placed in parallel with SCR 24 and a snubber circuit 35. Capacitor 40 charges on the positive half cycle of the AC power, but is prevented from discharging on the negative half cycle of the AC power by a blocking diode 42. However, if the negative voltage across capacitor 40 does not appear, it is indicative of solenoid 38 being shorted, i.e., there is no solenoid magnetic field that exists to collapse and produce the negative voltage. Further, if any of the components including differential transformer 2, GFI detector circuit 16, circuit 21, power supply 18, SCR 24, solenoid 38, capacitor 40, and blocking diode 42 of circuit 102 fail, capacitor 40 will not discharge through solenoid 38, and the negative voltage across capacitor 40 from the collapsing field of solenoid 38 will not appear.

When the negative voltage appears across capacitor 40, the input of end-of-life monitoring circuit 400 is driven LOW, triggering a first timer within end-of-life monitoring circuit 400 into a monostable timeout mode. Accordingly, as long as the components listed above, i.e., the differential transformer 2, GFI detector circuit 16, circuit 21, power supply 18, SCR 24, solenoid 38, capacitor 40, and blocking diode 42 of circuit 102 are operating properly; capacitor 40 will be periodically discharged to reset the first timer. As a result, the OUT 1 output of circuit 400 will not signal an end-of-life condition. However, if any of these components fail, capacitor 40 will not discharge through solenoid 38, and the negative voltage across capacitor 40 from the collapsing field of solenoid 38 will not appear. In this scenario, the first timer times out and OUT 1 signals an end-of-life condition.

In one embodiment, line 1125 and line 1127 are not connected to control gate 1116. In this embodiment LED 1124 is illuminated to signal an end-of-life condition and a second timer included in circuit 400 is initiated. When the second timer times out, OUT 2 turns SCR 1122 ON, current conducts through diode 42, and solenoid 38 is energized to trip circuit interrupter 73. Those of ordinary skill in the art will recognize that the end-of-life indicator 1124 may be implemented using a visual indication (i.e., an LED), an audible indication, or both. One benefit from this response method is that the user is alerted by an indication that the device has reached end-of-life. The user is then afforded a reasonable amount of time to replace the device before power to the load terminals becomes denied by the circuit interrupter. In one embodiment, the pre-determined time delay is twenty-four (24) hours. Any suitable time interval may be chosen. For example, the delay may be set at forty-eight (48) hours. Reference is made to U.S. patent application Ser. No. 11/025,509, which is incorporated herein by reference as though fully set forth in its entirety, for a more detailed explanation of the timer circuit 400 (See, e.g., FIGS. 1 and 2).

In an alternate embodiment, the end-of-life circuit includes redundancy features. In this scenario, line 1125 is disposed between OUT 1 and pin 10 of control gate 1116. Further, line 1127 is disposed between control gate pin 13 and a second input of end-of-life circuit 400. A redundant LED 1140 is connected to control gate 1116. The redundancy is configured to detect and respond to an end-of-life condition in circuit 400. The end-of-life condition in circuit 400 changes the signal on line 1127. LED 1140 is illuminated to signal the end-of-life condition and a third timer, included in control gate 1116, is initiated. The third timer has the benefit as has been described for the second timer. When the third timer times out, output 13 of control gate 1116 turns SCR 24 ON, current conducts through diode 42 and solenoid 38 is energized to trip circuit interrupter 73. Those of ordinary skill in the art will recognize that the end-of-life indicator 1140 may be implemented using a visual indication (i.e., an LED), an audible indication, or both.

It will be apparent to those of ordinary skill in the pertinent art that modifications and variations can be made to end-of-life circuit 400 depending on the configuration of output circuit 350 and/or control gate 1116. For example, circuit 400 may be implemented using a single monolithic integrated circuit or may be implemented using discrete timers and other discrete circuit elements. For example, OUT 1 may be the anode of an additional SCR device. Those of ordinary skill in the art will appreciate that other circuit variations are possible within the scope of the invention.

Control gate 1116 is coupled to detector 16 and configured to receive either detector output signal 1120 or filtered detector output signal 20. Control gate 1116 gates these signals and provides a gated and delayed detection signal to SCR 24 (SCR out). Control gate 1116 also provides both end-of-life functionality and self-test functionality. The self-test functionality is described as follows.

Control gate 1116 is configured to recycle between a test state and a non-test state. The durations of each of the two states are established by a timing circuit. Those of ordinary skill in the art will recognize that the timing circuit may be of any suitable type. For example, the timing circuit may be an external clocking arrangement driven by a local oscillator (not shown), a timer disposed in controller 1116, or by a zero cross circuit 1117 coupled to the AC power. When control gate 1116 is in the test state, it is configured to actuate self-test relay 1118 during a negative half-cycle. Upon actuation, self-test relay 1118 is configured to actuate the self-test circuit to initiate the self-test procedure.

Automated self-test circuit 1128 is coupled between line hot 13 and line neutral 11. Circuit 1128 includes contacts 1130 which are disposed in series with diode 4 and resistor 8. The self-test signal is generated by ground fault simulation circuit 1128 when relay 1118 turns on to close contacts 1130. Those of ordinary skill in the art will recognize that test circuit 1128 may be implemented using various alternate fault simulation circuits. For example, if control gate 1116 and self-test relay 1118 are programmed to close contacts 1130 only during the negative half cycle of AC power, diode 4 may be omitted. Alternatively, if contacts 1130 are configured to close for a full line cycle, diode 4 should be included to limit the simulated ground fault current to the negative half cycle. The current flowing through resistor 8 produces a difference current between the hot and neutral conductors, conductors 13 and 11, which is sensed by transformer 2, in the manner previously described. Of course, the SCR 24 cannot conduct line current during the negative half-cycle of the AC wave. However, if SCR 24 is not signaled by detector 16, the end-of-life sequence described above is initiated.

It will be apparent to those of ordinary skill in the pertinent art that modifications and variations can be made to control gate 1116 of the present invention depending on device selection and design issues. For example, control gate 1116 may be implemented using a microprocessor, an application specific integrated circuit (ASIC), or a combination of other electronic devices familiar to those skilled in the art. In the example shown in FIG. 11, control gate 1116 is implemented as a discrete microprocessor component. In another embodiment, control gate 1116 is combined in an ASIC with other device components and sub-systems. For example, an ASIC may include detector 16, self-test circuit 400, and other such components.

As those of ordinary skill in the pertinent art will recognize, self-test relay 1118 may be of any suitable type depending on electrical device characteristics. For example, relay 1118 may be implemented using an electro-mechanical relay. Relay 1118 may also be implemented using solid state switches such as a thyristor, SCR, triac, transistor, MOSFET, or other semiconductor devices.

The operation of control gate 1116 is now described in more detail. During recurring non-test state intervals, the detector output signal 20, or 1120, is directed to control gate 1116, as previously described. When control gate 1116 is in the non-test state, control gate 1116 de-activates the negative half cycle self-test signal by turning off self-test relay 1118, permitting detection of the true fault signal while avoiding the self-test signal interference. In this state, GFI 10 may detect a true fault signal in either half cycle, but is responsive to the fault only in the positive half cycles. The duration of the non-test state intervals may be selected within a time range between one (1) second and one (1) month. One month is typically considered as being the maximum safe interval between tests. In one embodiment, the duration of the non-test state interval is about one minute. The test/non-test cycle is recurring; each non-test cycle is followed by a test state cycle, and each test cycle is followed by a non-test state cycle.

Accordingly, GFI 10 is in a self-test mode during the test state interval. In one embodiment, a self-test signal is transmitted during the first negative half cycle in the test state interval. In another embodiment, the simulated test is effected in selected negative half-cycles or in each negative half-cycle in the test interval. In the circuit example depicted in FIG. 11, control gate 1116 activates simulated fault signal during a negative half cycle by turning on self-test relay 1118. The simulated test signal causes detector 16 to produce a signal at output 20 or at an alternate output 1120 during each negative half-cycle. Output 1120 provides the same information as output 20, but is configured to generate digital logic levels. Control gate 1116 gates the detector 16 output signal received during the negative half cycle to SCR 24. The gate functions to block any extended signal for a predetermined amount of time after the negative half cycle.

The predetermined time interval is chosen such that any remaining extended signal is substantially less than the expected true fault signal. The predetermined interval is typically set at 30 to 50 milliseconds. As a result, any self-test signal that extends beyond the negative half cycle does not cause false activation of SCR 24. However, the portion of the test acceptance signal propagating during the negative half cycles will cause the timer in ring detector 400 to reset. With regard to the predetermined time interval, by-pass circuit 1126 is provided to allow device 10 to respond in accordance with UL trip time requirements if a true fault condition occurs during the 30 to 50 millisecond dead period described above.

With regard to device 10 testing, the various embodiments of the device may be equipped with a manually accessible test button 1132 for closing switch contacts 1134 for initiating a simulated grounded hot fault signal, as current through resistor 1136, or alternatively, a simulated grounded neutral fault signal (not shown.) If GFI 10 is operational, closure of switch contacts 1134 initiates a tripping action. The purpose of the test button feature may be to allow the user to control GFCI 10 as a switch for applying or removing power from load 1106 connected to device 10, in which case test button 1132 and reset button 75 have been labeled "off" and "on" respectively. Usage of test button 1132 does not affect the performance of the ability to detect and respond to an end-of-life condition, or vice-versa.

Referring back to by-pass circuit 1126, by-pass circuit 1126 is configured to circumvent control gate 1116 under certain circumstances. In the event of a ground fault, the operation of control gate 1116 may be delayed by capacitive charging time constants in power supply 18 and by delays in control gate 1116, including software-related delays. These delays might prevent trip mechanism 73 from interrupting high amplitude ground fault currents greater than about 100 mA within known safe maximum time limits.

This trip time requirement is provided in UL 943. UL 943 includes an inverse time-current curve: $t=(20/I)^{1.43}$ where "I" is the fault current in milliamps (mA) and "t" is the trip time in seconds. Typical values for the fault current range between 6 mA and 264 mA. The 6 mA current is the "let-go threshold." In other words, UL does not consider currents less than 6 mA to be a hazard. The 264 mA limit corresponds to 132 VAC (the maximum source voltage) divided by 500 Ohms (the least body resistance for a human being). Applying the trip time curve, a 6 mA fault current is allowed a maximum trip time of 5 seconds. A 264 mA fault current is allowed a maximum trip time of 0.025 seconds. By-pass circuit 1126 is configured to actuate SCR 24 when the fault current exceeds 100 mA. According to the trip time curve, if the fault current equals 100 mA, the calculated trip time is 0.1 seconds (100 milliseconds.) Thus, the 30 to 50 millisecond dead period does not violate the UL trip time curve for true ground faults below 100 mA. For true fault currents above 100 mA, bypass circuit 1126 overrides the dead period lock-out. Accordingly, the present invention is in accordance with UL trip time requirements. Those of ordinary skill in the art will recognize that bypass circuit 1126 and detector 16 may be combined in a single monolithic integrated circuit.

Another feature of the present invention relates to noise immunity. The sources of transient noise include switching noise from the AC power source, electrical noise associated with loads having commutating motors with brushes, or the noise associated with various kinds of lamps or appliances. Noise immunity is a consideration because transient noise may interfere with the self-test signal. Under certain circumstances, noise may interfere with, or cancel, the self-test signal. Accordingly, the timer in circuit 400 may not be reset despite the fact that there is no internal fault condition in GFCI 10. Accordingly, in one embodiment the timer in circuit 400 is programmed to measure a time interval that spans four simulated test cycles, or a predetermined amount of time, such as four minutes, for example. Thus, circuit 400 need only detect one in four test acceptance signals during the time interval for timer reset. It is unlikely that a transient noise event would disturb either four consecutive negative half cycles or last for a period of 4 minutes. As such, programming the timer in this manner desensitizes GFCI 10 to the effects of transient electrical noise.

Figure 12:
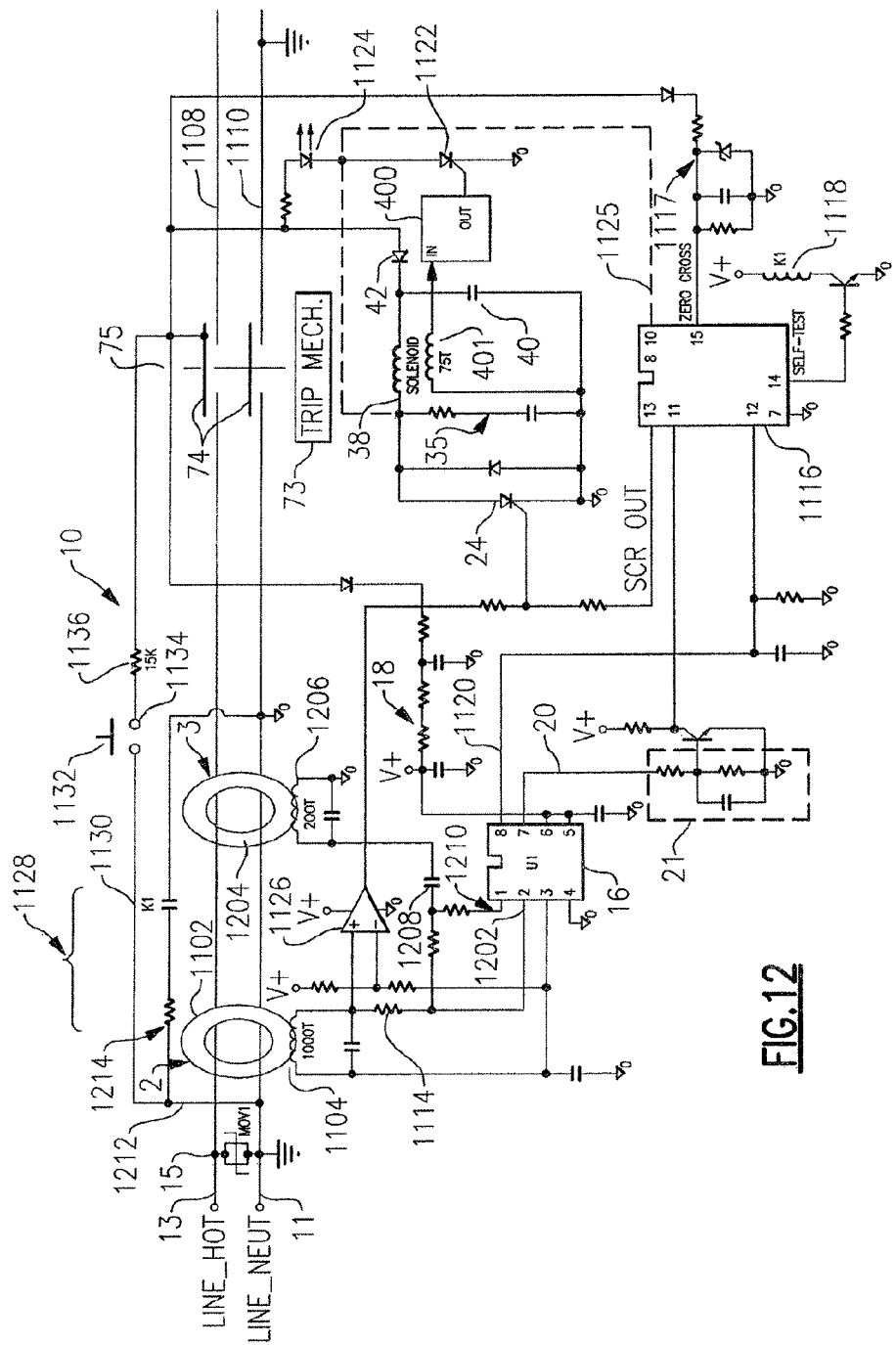
FIG. 12 is a schematic of a circuit protection device in accordance with a third embodiment of the present invention.

As embodied herein and depicted in FIG. 12, a schematic of a circuit protection device in accordance with a second embodiment of the present invention is disclosed. FIG. 12 is a schematic diagram of an alternate embodiment in which the fault simulation circuit generates a simulated negative half cycle grounded neutral signal. Reference is made to U.S. patent application Ser. No. 10/768,530, which is incorporated herein by reference as though fully set forth in its entirety, for a more detailed explanation of the fault simulation signal. Note that test circuit 1128 does not include diode 4.

The GFI circuit 102 in FIG. 12 includes a transformer 2 that is configured to sense a load-side ground fault when there is a difference in current between the hot and neutral conductors. Transformer 2 transmits a sensed signal to detector circuit 16. GFI circuit 102 also includes a grounded neutral transmitter 3 that is configured to detect grounded neutral conditions. Those skilled in the art understand that the conductor connected to neutral line terminal 11 is deliberately grounded in the electrical circuit. On the other hand, a grounded neutral condition occurs when a conductor connected to load neutral terminal 1110 is accidentally grounded.

The grounded neutral condition creates a parallel conductive path with the return path disposed between load terminal 1110 and line terminal 11. When a grounded neutral condition is not present, grounded neutral transmitter 3 is configured to couple equal signals into the hot and neutral conductors. As noted above, transformer 2 senses a current differential. Thus, when no fault condition exists, the current flowing in the hot conductor cancels the current flowing in the neutral conductor. However, when a grounded neutral condition is present, the signal coupled onto the neutral conductor circulates as a current around the parallel conductive path and the return path, forming a conductive loop which is simulated by conductive loop 1212. Since the circulating current propagates through the neutral conductor but not the hot conductor, a differential current is generated. Transformer 2 detects the differential current between the hot and neutral conductors. As such, detector 16 produces a signal on output 20 in response to the grounded neutral condition.

In one embodiment, ground fault detector 16 is implemented using an RV 4141 integrated circuit manufactured by Fairchild Semiconductor. Those of ordinary skill in the art will understand that any suitable device may be employed herein. Transformer 2 may be implemented using a toroidally shaped magnetic core 1102 about which a winding 1104 is wound. Winding 1104 is coupled to an input terminal 1202 of ground fault detector 16. Winding 1104 typically has 1,000 turns. Grounded neutral transmitter 3 may be implemented using a second toroidally shaped magnetic core 1204 about which a winding 1206 is wound. Winding 1206 is coupled in series with a capacitor 1208 to the gain output terminal 1210 of ground fault detector 16. Winding 1206 typically has 200 turns. Hot and neutral conductors 13 and 11 pass through the apertures of cores 1102 and 1204.

During a grounded neutral condition, low level electrical noise indigenous to the electrical circuit or to ground fault detector 16 creates a magnetic flux in either core 1102 or 1204, or both. The flux in core 1204 is induced by winding 1206. Core 1204 induces a circulating current in electrical loop 1212, which induces a flux in core 1102. The resulting signal from winding 1104 is amplified by the gain of ground fault detector 16 to produce an even greater flux in core 1204 via winding 1206. Because of this regenerative feedback action, ground fault detector 16 breaks into oscillation. The frequency typically is in a range between 5 kHz and 10 kHz. This oscillation produces a signal on output 20. Control gate 1116 ultimately signals SCR 24 to trip the device 10.

Electrical loop 1212 is part of the fault simulation circuit 1128. Loop 1212 has a resistance associated with it; the resistance is shown in FIG. 12 as lumped resistance 1214. Resistance 1214 is typically less than 2 Ohms Electrical loop 1212 couples the grounded neutral transmitter 3 and ground fault detector 2 when contacts 1130 are closed during at least first negative half cycle of each test state interval. Accordingly, a simulated grounded neutral condition is generated only during the negative half cycle. The simulated grounded neutral condition causes detector 16 to generate a fault detect output signal on line 20 to retrigger the timer in ring detector 400 during test state intervals. Absence of the timer reset signal indicates that the device has reached its end of life. As previously discussed, the end of life condition causes activation of an end of life indicator, tripping of interrupting contacts, or both.

Again, the various embodiments of the device may be equipped with a manually accessible test button 1132 configured to close switch contacts 1134. Upon closure of contacts 1134, current flows through resistor 1136 and a simulated grounded hot fault signal is initiated. In another embodiment, a simulated grounded neutral fault signal (not shown) is initiated by actuating test button 1132. If GFI 10 is operational, closure of switch contacts 1134 initiates a tripping action. The purpose of the test button feature may be to allow the user to control GFCI 10 as a switch for applying or removing power from load 1106. As such, test button 1132 and reset button 75 may be labeled "off" and "on," respectively. Usage of test button 1132 does not affect the ability to detect and respond to an end-of-life condition. or vice-versa.

The GFI output circuit 350, circuit 400, and control gate 1116 are similar, if not identical, to those depicted in FIG. 11.

Figure 13:
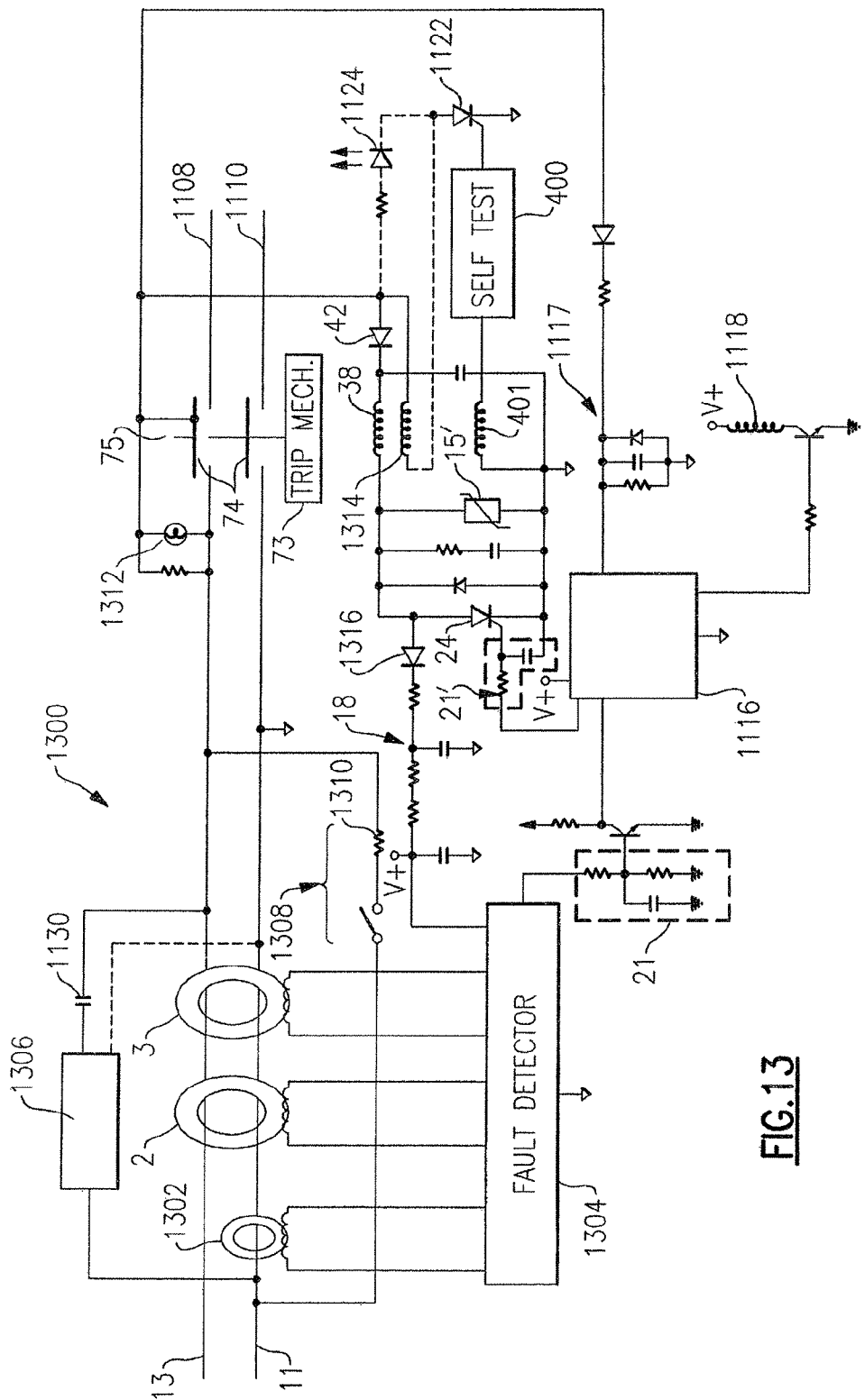
FIG. 13 is a schematic of a circuit protection device in accordance with a fourth embodiment of the present invention.

As embodied herein and depicted in FIG. 13, a schematic of a circuit protection device in accordance with a third embodiment of the present invention is disclosed. FIG. 13 is a schematic diagram that illustrates how the present invention may be applied to a general protective device 300. Further, FIG. 13 incorporates a redundant solenoid.

If sensor 1302 is included, the protective device is an AFCI. If transformers 2 and 3 are included, the protective device is a GFCI. If sensor 1302, and transformers 2 and 3 are included, the protective device is a combination AFCI-GFCI. Stated generally, the protective device may include one or more, or a combination of sensors configured to sense one or more type of hazardous conditions in the load, or in the AC electrical circuit supplying power to the load. Sensor 1302 senses an arc fault signature in load current. Detector 1304 is similar to ground fault detector 16, but is configured to detect signals from any of the variety of sensors employed in the design. Detector may also provide a signal to a transmitter, such as transformer 3.

Fault simulation circuit 1306 is similar to fault simulation circuit 1128 but configured to produce one or more simulation signal to confirm that the protective device is operational. Contacts 1130 are closed by operation of relay 1118 during a test state interval. Fault simulation signals are generated during negative half cycles of AC power. The embodiment of FIG. 13 is similar to the previous embodiments discussed herein, in that any extended test fault signals from fault detector 1304 to SCR 24 are blocked by control gate 1116. In this manner, simulation signals that extend into positive half cycles of the AC power line do not result SCR 24 being turned ON. Accordingly, false actuations of the circuit interrupter are prevented.

Other features and benefits can be added to the various embodiments of the invention. GFCI 10 may be equipped with a miswiring detection feature such as miswire network 1308. Reference is made to U.S. Pat. No. 6,522,510, which is incorporated herein by reference as though fully set forth in its entirety, for a more detailed explanation of miswire network 1308.

Briefly stated, miswire network 1308 is configured to produce a simulated ground fault condition. During the installation of protective device 300 if the power source voltage is coupled to the line terminals 11 and 13 as intended, the current through network 1308 causes the protective device to trip. However, the current through network 1308 continues to flow until a fusible component in network 1308 open circuits due to I²R heating. The fusible component may be implemented by resistor 1310, which is configured to fuse in typically 1 to 10 seconds. The protective device 300 may be reset after the fusible component opens. Subsequently, the protective device 300 and checking circuit 400 operate in the previously described manner. However, when the device is miswired by connecting the power source to the load terminals 1108 and 1110 during installation, GFI 102 trips the interrupting contacts 74 before the fusible component opens. The current flow through network 1308 is terminated in less than 0.1 seconds. This time period is too brief an interval to cause the fusible component to fail. Thus, when protective device 300 is miswired, the fusible element in network 1308 remains intact. Accordingly, reset button 75 cannot effect a resetting action. Protective device 300 cannot be reset regardless of signals to or from checking circuit 400.

As discussed above and shown in earlier embodiments, an across-the-line metal oxide varistor (MOV), also commonly referred to as a movistor, may be included in the protective device to prevent damage of the protective device from high voltage surges from the AC power source. The movistor is typically 12 mm in size. Alternatively, a much smaller MOV may be employed in the circuit when it is coupled with an inductance.

In this embodiment, MOV 15' is coupled with solenoid 38. The value of the inductive reactance of solenoid 38 is typically greater than 50 Ohms at the frequency of the surge voltage. The inductive reactance serves to reduce the surge current absorbed by the movistor, permitting MOV 15' to have a lower energy rating. Accordingly, the size of the movistor may be reduced to a 5 mm diameter device. Further, the MOV may be replaced altogether by a surge-absorbing capacitor, air gap, or any of other surge protection methods familiar to those who are skilled in the art.

Protective device 300 may also include a trip indicator 1312. Indicator 1312 is configured to illuminate a trip indication, and/or audibly annunciate a trip indication, when protective device 300 is tripped. Trip indicator 1312 also functions to direct the user to the location of the tripped device.

Another feature of the embodiment shown in FIG. 13 relates to the redundant solenoid design. Upon reaching end-of-life, solenoid 38 typically fails by developing an open circuit condition. Solenoid 1314 may be added to provide redundancy. If solenoid 38 open circuits, secondary 401 does not receive self-test signal. However, circuit 400 is able to trip out the protective device by actuating redundant solenoid 1314. Solenoid 1314 may be magnetically coupled to solenoid 38. Other redundancies may be included in device 300. Redundant components permit the protective device and/or permit circuit 400 to function. For example, diode 1316 included in power supply 18 can comprise two diodes in parallel, such that if one diode open circuits, that second diode continues to maintain supply voltage.

Figure 14:
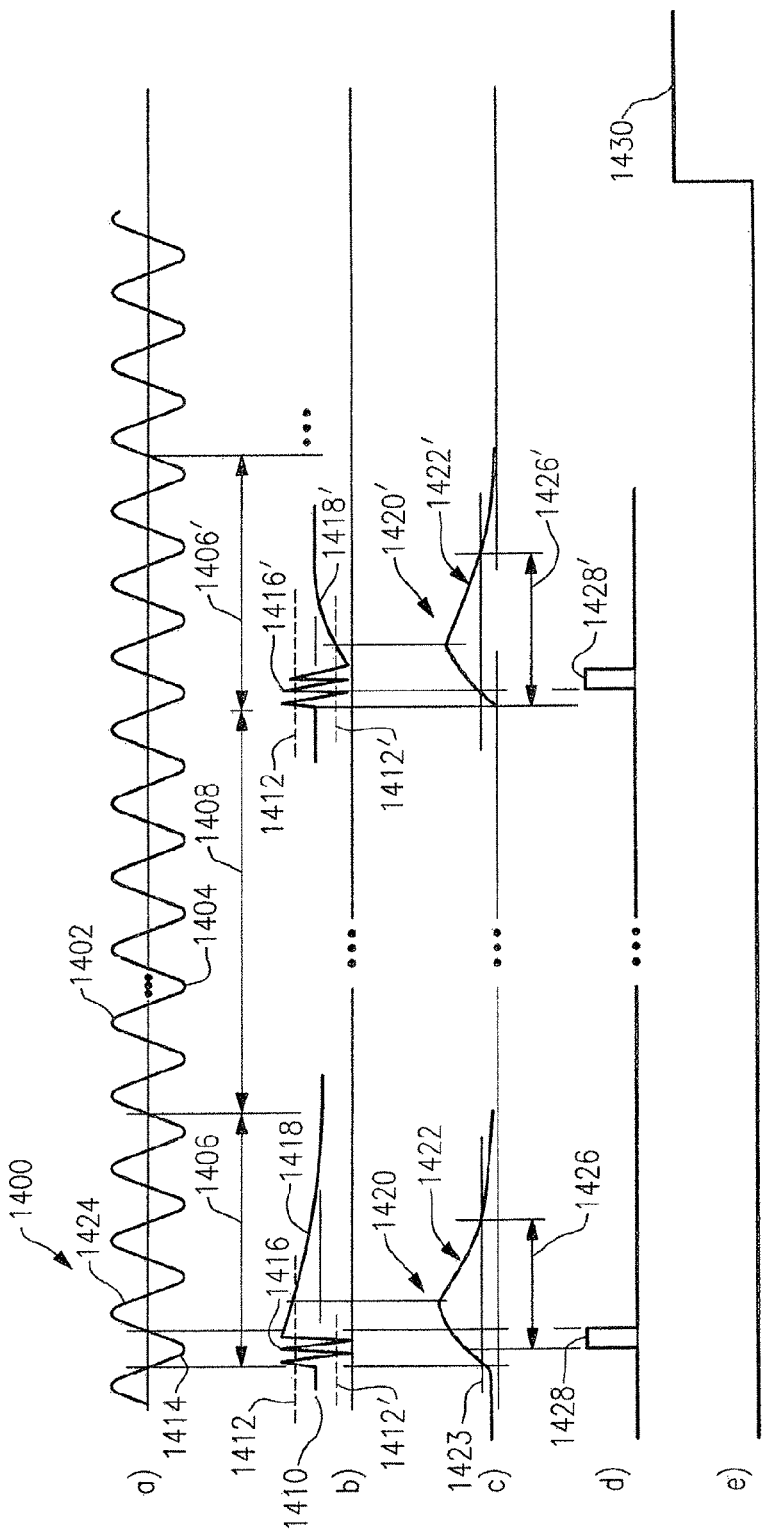
FIG. 14 is an example of a timing diagram illustrating the operation of the circuit depicted in FIG. 12.

Referring to FIG. 14, a timing diagram illustrating the operation of the circuit depicted in FIG. 12 is shown. FIG. 14a shows the AC power source signal 1400. AC signal 1400 includes positive half cycles 1402 and negative half cycles 1404. Control gate 1116 subdivides time into alternating test state interval 1406 and non-test state interval 1408. FIG. 14b represents the gain output waveform at detector input terminal 1210. Voltage signal 1410 is the quiescent level when there is no fault condition, whether a simulated fault condition or true fault condition. The quiescent voltage level 1410 is centered between pre-established voltage thresholds 1412 and 1412'. The threshold levels are established by ground fault detector 16. During the first negative half cycle 1414 within second state interval 1406, contacts 1130 close, initiating a simulated grounded neutral fault. The simulated grounded neutral fault results in signal 1416. The positive amplitude and the negative amplitude of signal 1416 is greater than voltage threshold 1412 or less than voltage threshold 1412', respectively. Both the positive amplitude peak and the negative amplitude nadir cause detector 16 to generate a detection signal at output 20. FIG. 14c represents the resultant signal from filter circuit 21. Control gate 1116 couples signals 1416 to timer 52 (embodiment of FIG. 1), or the timer internal to detector 400, causing the timer to reset. Although the simulated grounded neutral fault terminates abruptly at the conclusion of negative half cycle 1414, there is residual flux in core 1102, shown electrically as transient 1418. The transient signal is delayed by filter circuit 21. The delayed transient is shown in FIG. 14c as delayed transient signal 1422.

Referring to FIGS. 14c-14d, the residual flux and other similar effects cause the self-test signal 1420 to extend into positive half cycles 1424. Note that a portion 1426 of delayed transient signal 1422 extends into the next positive half cycle and exceeds the predetermined threshold 1423. Referring to FIG. 14d, control gate 1116 transmits pulse 1428 to SCR 24. Pulse 1428 corresponds to that portion of signal 1420 propagating during the negative half cycle 1414. Thus, control gate 1116 prevents nuisance tripping.

Referring back to FIG. 14a, test state intervals 1406 are typically chosen to be 50 milliseconds, a time interval that is greater than the expected intervals of transients 1418 and 1422. As such, non-test state intervals 1408 are devoid of test signal transients (extended signal.) However, if a true fault current is present during either interval, the fault is detected by detector 16, filtered by circuit 21, and coupled to SCR 24 by control gate 1116 in the manner previously described herein.

Referring back to the issue of transient electrical noise, the elapsed time measured by timer 52 can be increased to include one or more test state intervals. If the transient electrical noise interferes with the generation of pulse 1428, the fault detection circuitry may generate pulse 1428' during a subsequent test state interval. Because the timer is configured to measure more than one set of test and non-test state intervals, the timer may be reset before a false end-of-life tripping occurs. In this manner, false end-of-life indication can be avoided by selecting an established time that is greater than the duration of at least two first state intervals.

FIG. 14e shows the output of timer 52. If a retrigger signal is not received by timer 52 within the established time set by timer 52, timer 52 generates signal 1430 which actuates the end-of-life response mechanism.

Although the timing diagrams in FIG. 14 have been described in association with the embodiment shown in FIG. 12, the principles of operation similarly apply to the other embodiments of the invention.

Figure 15:
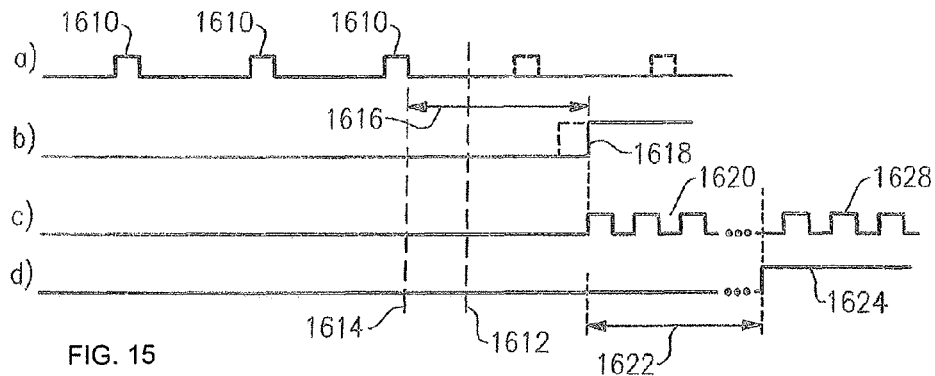
FIG. 15 shows the timing sequence for the end-of-life indication and lock-out features of the present invention.
Figure 16:
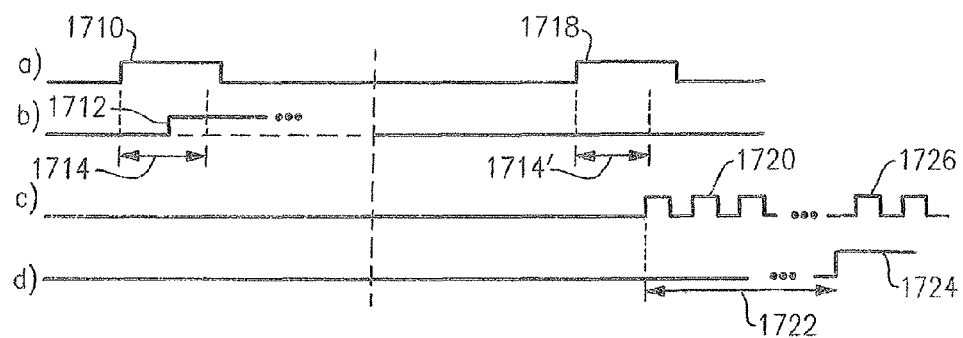
FIG. 16 are timing diagrams illustrating the manual test features of the present invention.
Figure 17:
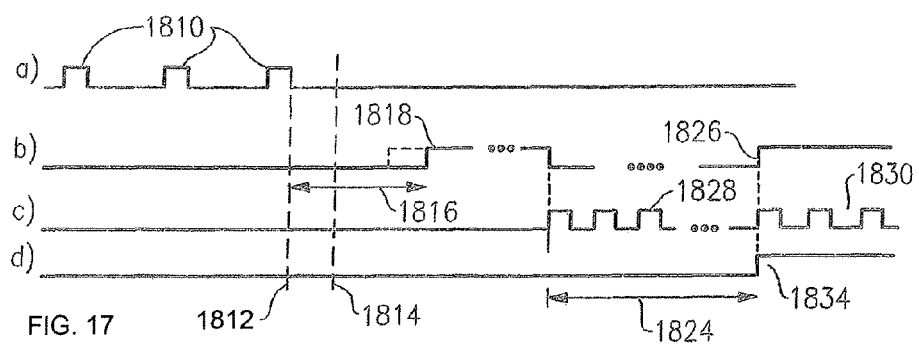
FIG. 17 are timing diagrams illustrating the reset functionality of the present invention.

Referring to FIGS. 15-17 are directed to timing diagrams that illustrate different methods for indicating the end-of-life condition before power is permanently denied to the load terminals of the device. The timing diagrams illustrate a method for providing a user with an end-of-life indication before power is permanently denied to the load by interrupting the device contacts in a non-resettable way.

FIG. 15 shows the timing sequence for end-of-life indication and lock-out. As described above, self-testing occurs periodically on the negative half-cycle of AC power. As such, signal "a" represents the recurring test acceptance signals from the GFI portion of device 10, i.e., the input to end-of-life monitor circuit 400. The second signal (b) represents the first timer in circuit 400. At time 1612 one of the components listed above fails, representing an end-of-life condition. Accordingly, the last input pulse 1610 is received by circuit 400 at time 1614. An end-of-life condition occurs at time 1618 when the first timer time-out occurs. In other words, if a test acceptance signal is not detected within time interval 1616, an end-of life signal 1618 is generated by the first timer. Signal (c) represents end-of-life indicator 1124. Pulses 1620 indicate that LED 1124 (or an audible indicator) may be pulsed to provide a blinking light or a periodic beeping sound. Alternatively, LED 1124 may be illuminated continuously. In another embodiment, an end-of-life indicator 1140 may be connected to receive signal from control gate 1116 (See FIG. 11 and FIG. 12). Control gate 1116 is configured to generate an intermittent signal to indicator 1140 when an end-of-life condition has been detected. Signal (d) represents a lock-out signal such as signal OUT 2 from circuit 400 or SCR OUT from gate 1116. Lock-out signal (d) is generated following the predetermined amount of time 1622 established by a second timer. As shown, signal (d) generates a lock-out pulse 1624 that permanently disconnects the load terminals from the line terminals of device 10 (300.) Those skilled in the art will recognize that signal (d) may be configured as an active LOW signal, as shown in FIG. 11 and/or FIG. 12.

In one embodiment of the present invention lock-out pulse 1624 is operative to trip the trip mechanism 73. In another embodiment, a separate set of redundant end-of-life contacts are provided. In this case, lock-out pulse 1624 is operative to separate the redundant contact structure. The redundant structure may not rely on the state (i.e., reset or tripped) of trip mechanism 73. In yet another embodiment, an end-of-life indication signal 1628 may be included for continuing to energize the end-of-life indicator 1124 (1140) after lock-out has occurred. The continued blinking light, or beeping noise, helps the user locate the failed device causing loss of power.

Referring to FIG. 16, timing diagrams illustrating the manual test features of the present invention are provided. Signal (a) represents the manual test circuit. Pulse 1710 is generated by manual actuation of the test button 1132. Signal (b) represents test acceptance signal 1712. Note that test acceptance signal 1712, in this case, is generated by detector 16 and output circuit 350 within a test acceptance interval 1714, indicating that protective device 10 is operational. Pulse 1718 represents another manual actuation of the test button 1132. However, in this case there is an end-of-life condition as evidenced by a lack of any test acceptance signal 1712 within test acceptance interval 1714'. Accordingly, end-of-life signal 1618 is again generated. Signal (c) represents the operation of the end-of-life indicator 1124 (1140.) Signals 1720 and 1726 are similar to signals 1620, 1628 that have been previously described. Signal (d) represents the lock-out signal 1724 that is generated after predetermined amount of time 1722 elapses. Lock-out signal 1724 permanently disconnects the line terminals of device 10 (300) from the line terminals.

FIG. 17 is directed to an embodiment of the invention that includes a reset capability. Signal (a) represents the test acceptance signals 1810. Again, test acceptance signals indicate that protective device 10 (300) is operative to sense, detect, and protect device 10 for at least one of the intended predetermined conditions. At time 1812 one of the above listed components fails and in response, the last test acceptance signal is transmitted at time 1814. Signal (b) refers to SCR OUT or an output of circuit 400. If a test acceptance signal is not detected within time interval 1816, pulse 1818 is generated, directing trip mechanism 73 to trip. The falling edge of pulse 1818 corresponds to a user manually depressing the reset button 75 (FIG. 11). Signal (c) represents the output of visual indicator 1124 (or an audible indicator). Once the user resets device 10 (300), indicator 1124 begins to blink indicating that an end-of-life condition has occurred. A predetermined time interval 1824 is initiated when the trip mechanism 73 is reset. After time interval 1824 elapses, lock-out pulse 1826 is generated by either control gate 1116 or circuit 400 in the manner previously described. As a result, trip mechanism 73 permanently trips at the rising edge of pulse 1826, when the predetermined time interval 1824 has expired. In reference to indicator signal (c), an ongoing indicator signal 1830 may be provided to continually energize end-of life indicator 1124 (1140) after the predetermined time interval 1824 for the reasons previously provided.

Should a test acceptance signal be generated during time interval 1622 (1722, 1824), control gate 1116 and/or circuit 400 may be configured to ignore the test acceptance signal. Accordingly, device 10 (300) trips when the predetermined time delay has elapsed in the manner previously described. In an alternate embodiment, control gate 1116 and/or circuit 400 may be configured or programmed to recognize the test acceptance signal.

If the test acceptance signal is recognized, the end-of-life signal and the lock-out signal are both cancelled. This is another noise immunity feature of the present invention. If noise on the electrical distribution system momentarily defeats the recurring test signal, device 10 may recover, preventing an erroneous end-of-life lock-out to occur. Alternatively, a "wait delay" may be included between the expiration of interval 1616 (1714, 1816) and the onset of interval 1622 (1722, 1824). In this manner, circuit 400 generates an end-of-life signal as before, but the end of life indicator 1124, (1140) is not energized until the wait delay elapses. Power denial may be delayed by 24 to 48 hours after an end-of-life condition is detected (the predetermined amount of time.) Activation of the indicator may be delayed by 5 seconds to 5 hours after an end-of-life condition is detected (the wait delay interval.)

The user is made aware of the end-of-life condition by the end-of-life indicator, after which the user is given a predetermined amount of time before power is denied to the load terminals. In yet another alternative, device 10 (300) includes a counter responsive to the reset button. After an end-of-life condition has occurred, the counter allots the user a predetermined number of reset cycles before power is permanently denied to the load terminals. During each reset cycle, the reset button enables the line terminals to be connected to the load terminals but only for a predetermined period of time. As such, each reset cycle serves to remind the user of the end-of-life condition. The reset cycles may be of decreasing duration as further incentive to replace the device before power to the load terminals becomes permanently denied.

Those of ordinary skill in the art will recognize that the timing intervals depicted in the timing diagrams may be altered and modified within the scope of the present invention. Visual indicators may be of various colors or flashing patterns so as to be distinguishable from other types of indicators included in device 10 (300), such as a trip indicator 1312, or a pilot light configured to illuminate when power is applied to the load terminals (not shown). Two or more types of indicators may be configured to emit light from the same location in the housing of device 10 (300.) Visual or audible indicators may progress through various patterns, sounds, or colors that serve to increasingly draw attention of the user to the impending lock-out condition.

Figure 18:
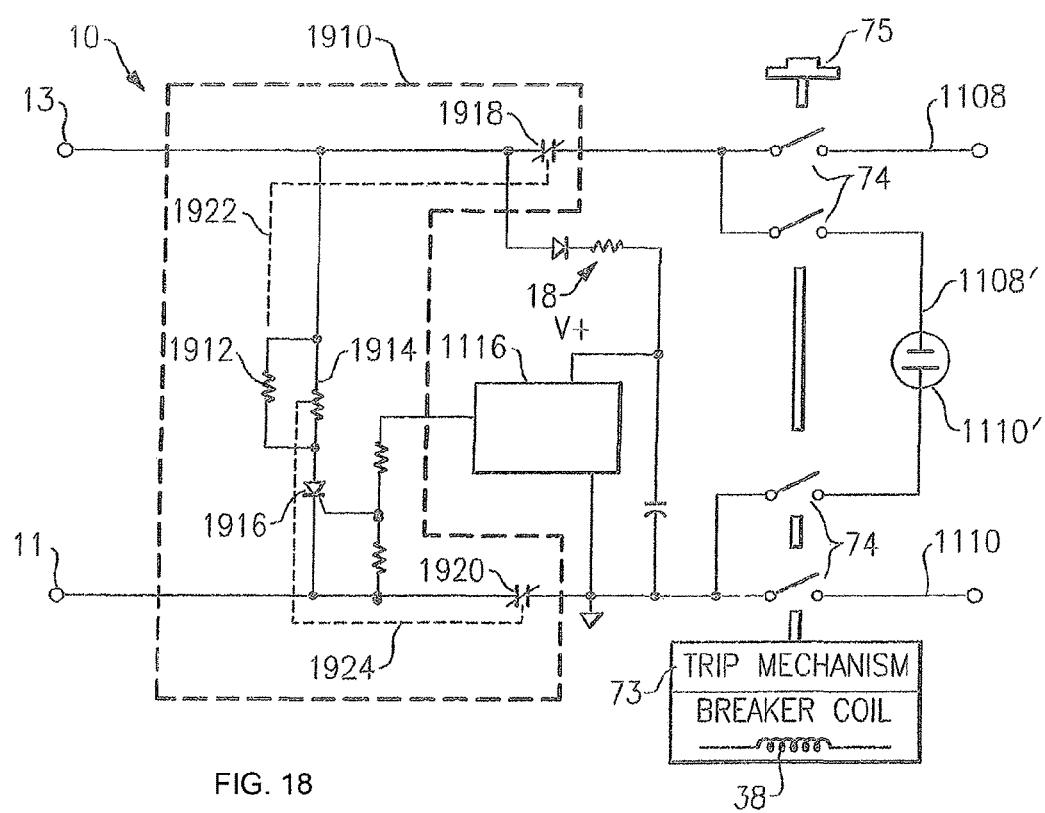
FIG. 18 is a schematic of a protective circuit that includes a power denial mechanism in accordance with the present invention.
Figure 19:
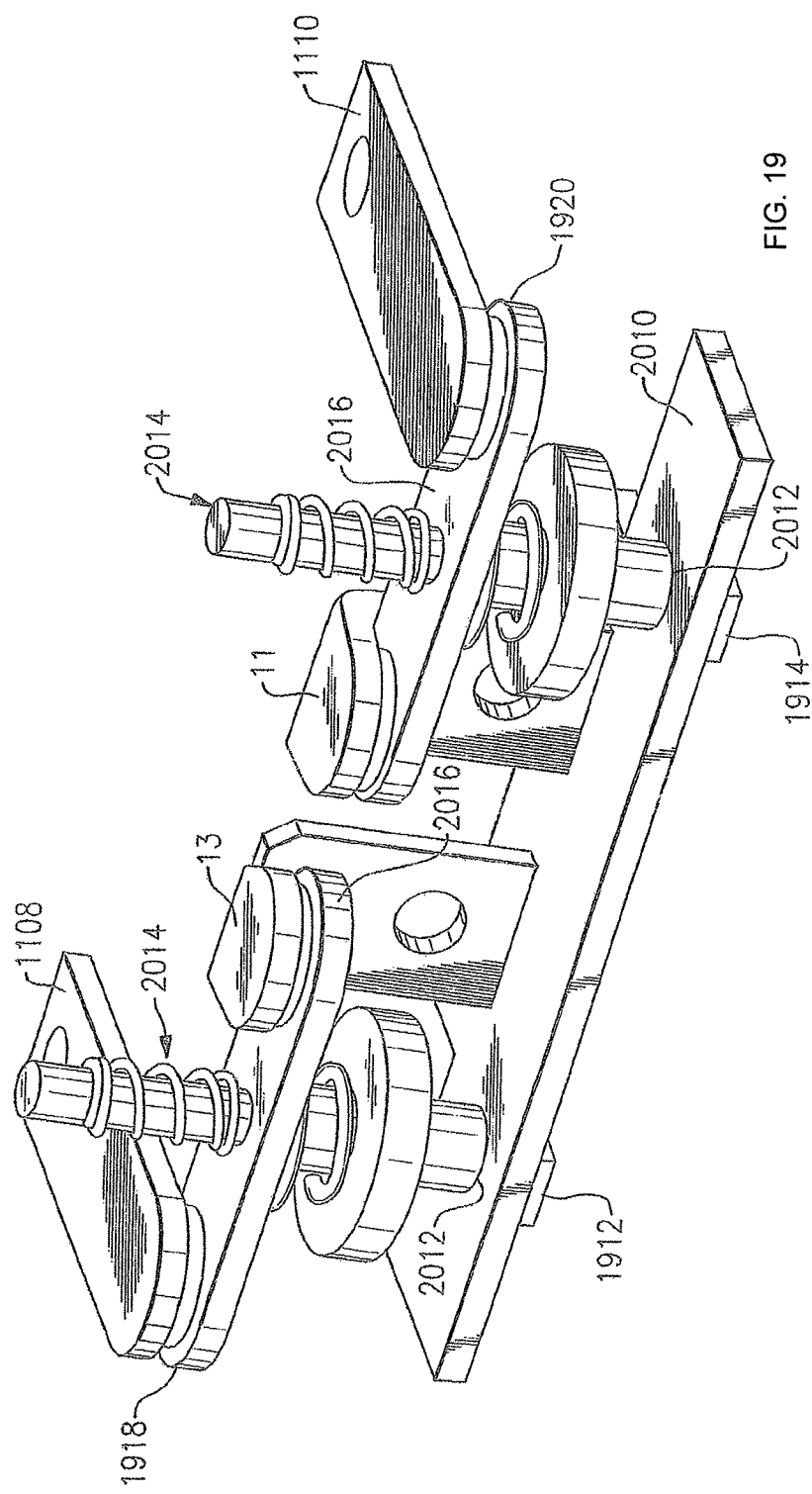
FIG. 19 is a perspective view of the power denial mechanism shown in FIG. 18.
Figure 20:
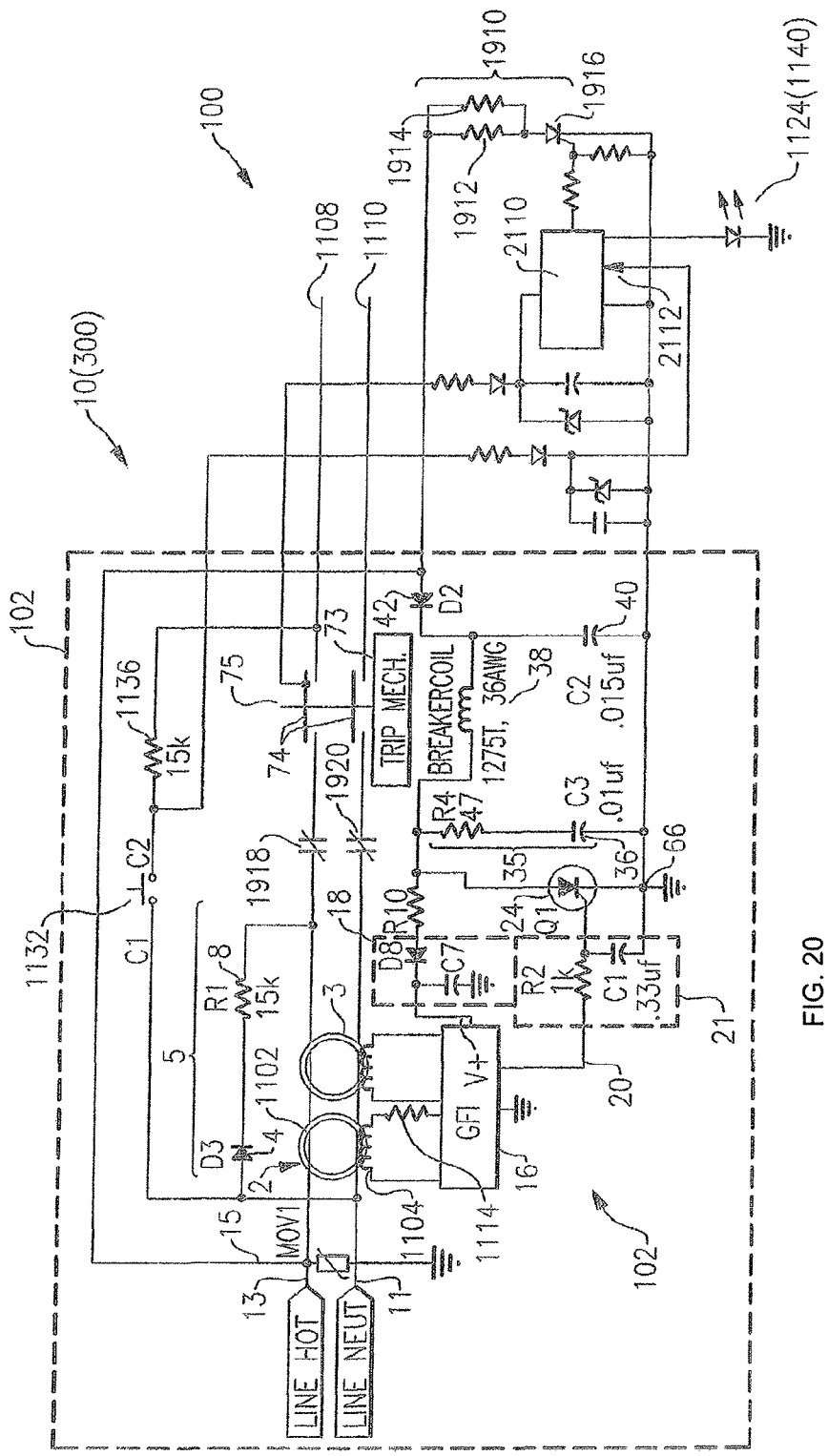
FIG. 20 is a schematic of a circuit protection device in accordance with a fourth embodiment of the present invention.

FIGS. 18-20 depict alternate embodiments for denying power after an end-of-life condition has occurred. The embodiments that have been described include a redundant solenoid such that if the trip solenoid associated with the protective device circuit experiences an end-of-life condition, the redundant solenoid assures that power is denied to the load terminals. Alternatively, the trip mechanism itself may have an end-of-life condition. The checking circuit identifies the condition and proceeds to enable the indicator and a power denial mechanism. The power denial mechanism is configured to operate substantially independently from the trip mechanism, whether the trip mechanism is in the tripped or reset states.

As embodied herein and depicted in FIG. 18, a protective circuit 10 that includes a power denial mechanism is disclosed. Power denial mechanism 1910 includes parallel resistors 1912, 1914 and SCR 1916 coupled between the line terminals 11, 13. Resistors 1912, 1914 are configured to heat to a temperature greater than a pre-established temperature threshold when device 10 (300) has an internal fault. When the temperature of resistors 1912, 1914 is greater than the threshold, the line terminals 11, 13 decouple from the feed-through load terminals 1108, 1110, and receptacle load terminals 1108', 1110'. Because resistors 1912, 1914 are disposed in parallel, they heat independently. Dashed line 1922 indicates that resistor 1912 is configured to open contact 1918 when the temperature exceeds the threshold value. Likewise, dashed line 1924 indicates that resistor 1914 is configured to open contact 1920 when the temperature exceeds the threshold value. In another embodiment of the present invention, a single resistor can be configured to heat and open contacts 1918 and 1920.

Power denial mechanism 1910 operates as follows. When the predetermined amount of time described above elapses, control gate 1116 generates an output signal to turn SCR 1916 ON. The resulting current through resistors 1912, 1914 causes the temperature of each resistor to be greater than the threshold, whereupon end-of-life contacts 1918, 1920 are opened. The end-of-life contacts open irrespective of the operable condition of trip mechanism 73, disconnecting the load terminals from the line terminals.

Referring to FIG. 19, a perspective view of the power denial mechanism 1910 shown schematically in FIG. 18 is depicted. Resistors 1912 and 1914 are soldered to the underside of a printed circuit board (PCB) 2010. Openings 2012 are disposed in PCB 2010 in alignment with resistors 1912 and 1914. Resistors 1912 and 1914 prevent spring loaded plungers 2014 from extending through the openings 2012 in board 2010. Each plunger 2014 is configured to support an electrically connecting bus-bar member 2016. Each bus-bar 2016 couples a line terminal (11,13) to at least one load terminal (1108, 1108', 1110, 1110'.) As described above, when the solder supporting 1912 and 1914 melts, spring loaded plungers 2014 are driven through the holes 2012, breaking the connections between the line and the load terminals. Once this occurs, there is no mechanism for resetting the device. Accordingly, the device must be replaced.

As embodied herein and depicted in FIG. 20, a schematic of a circuit protection device in accordance with a fourth embodiment of the present invention is disclosed. GFCI 10 includes a GFI circuit 102 and a self test checking circuit 2110. GFI circuit 102 includes a standard GFCI device in which a load-side ground fault is sensed by a differential transformer 2. A transformer 3, which is a grounded neutral transmitter, is used to sense grounded neutral faults. The transformer 2 output is processed by a GFI detector circuit 16 which produces a signal on output 20 that, after filtering in a circuit 21, activates a trip SCR 24. When SCR 24 turns ON, it activates a solenoid 38 which in turn operates a mouse trap device 73, releasing a plurality of contacts 74 and interrupting the load.

An across-the-line metal oxide varistor (MOV1), also commonly referred to as a movistor, may be included in the protective device such as MOV 15 to prevent damage of the protective device from high voltage surges from the AC power source. The movistor is typically 12 mm in size.

A power supply 18 provides power for GFI detector circuit 16 for full cycle operation. A negative cycle bypass circuit 5, which preferably includes a diode 4 in series with a resistor 8, introduces a bypass current, simulating a ground fault, between neutral and hot lines 11, 13 during the negative half cycle of the AC power. The same bypass current could also be produced by placing bypass circuit 5 between lines 11 and 13 with the diode 4 anode at neutral line 11.

The GFI 102 output circuit is formed by placing capacitor 40 in series with solenoid 38 to thereby form a resonating tank circuit. The tank circuit is placed in parallel with SCR 24 and a snubber circuit 35. Capacitor 40 charges on the positive half cycle of the AC power, but is prevented from discharging on the negative half cycle of the AC power by a blocking diode 42.

In this embodiment, both the end-of-life checking circuit and the control gate are embodied in a single component, control gate 2110. Control gate 2110 is coupled to a power denial mechanism 1910, which is configured to operate as follows.

The user pushes the TEST button 1132 when the device is in the reset state to simulate a fault. The fault is introduced through resistor 1136. Although the simulated fault is shown as a ground fault, an arc fault simulation could have been chosen. The present invention is equally applicable to GFCI, AFCI, or GFCI/AFCI devices. Control gate 2110 is similar to control gate 1116. However, gate 2110 includes an input 2112 coupled to the test button 1132. When test button 1132 is depressed, control gate 2110 energizes indicator 1124 (1140). If the components in GFI 102 are operative, i.e., sensor 1102, detector 16, SCR 24, and trip mechanism 73, the device operates normally, and trip mechanism 73 is tripped. In response, power is removed from control gate 2110 and the indicator 1124 (1140) is de-energized.

However, if one of the components in GFI 102 is inoperative, i.e., has reached an end-of-life condition, indicator 1124 (1140) emits a visual or audible signal for at least the predetermined amount of time in the manner previously described. After the predetermined amount of time has elapsed, control gate 2110 actuates the power denial mechanism 1910, again, in the manner previously described.

In another embodiment, power denial mechanism 1910 is omitted, and SCR 1916 operates breaker coil 38 or independent solenoid 1314 (See FIG. 13) to permanently disconnect the line terminals from the load terminals.

Figure 21:
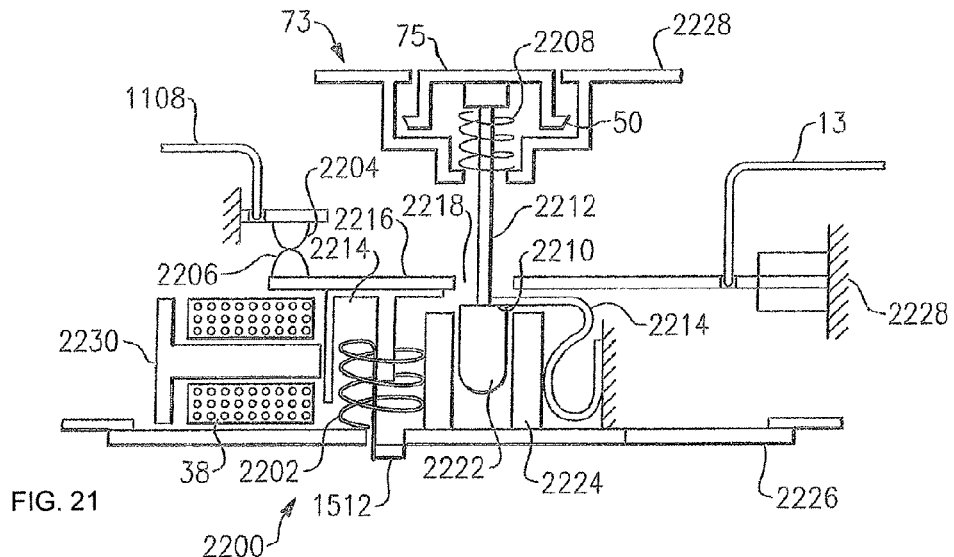
FIG. 21, a partial sectional view of a power denial mechanism in accordance with a fifth embodiment of the invention.

As embodied herein and depicted in FIG. 21, a partial sectional view of a power denial mechanism in accordance with a fifth embodiment of the invention is disclosed. Power denial mechanism 2200 is similar in function to the embodiments depicted in FIG. 13 and FIG. 18 because it is configured to deny power to a load in the event of trip solenoid 38 reaching an end-of-life condition.

In particular, FIG. 21 shows trip mechanism 73 in the reset position, meaning that contacts 2204 and 2206 are closed. Contacts 2204 and 2206 are held closed by action of a trapped make-force spring 2208. Spring 2208 acts on escapement 2210 and on reset stem 2212, to lift a reset latch 2214. The reset latch 2214, in turn, lifts the contact arm 2216 to close contacts 2204 and 2206. Reset latch 2214 includes a hole 2218 and contact arm 2216 includes a hole 2219. Holes 2218 and 2219 permit entry of a tip 2222 of the reset stem 2212 into an interior void formed by latch block 2224. In fact, the reset stem 2212 is prevented from moving laterally (i.e., is held in place) by latch block 2224. The armature (i.e., contact arm) 2216 and a printed circuit board (PCB) 2226 are mechanically referenced to a housing 2228. The make force in spring 2208, therefore, directed against the contact armature 2216 to thereby close contacts 2204, 2206. Electrical components associated with the circuit diagram shown in the various embodiments of the invention may be disposed on circuit board (PCB) 2226.

Resistor 1912 is designed to develop a temperature greater than a predetermined threshold when device 10 (300) develops an end-of-life condition. Resistor 1912 is physically positioned to restrain lockout spring 2202. Resistor 1912 (1914) is preferably mounted and soldered so that the body of resistor 1912 (1914) impedes movement of lockout spring 2202.

Figure 22:
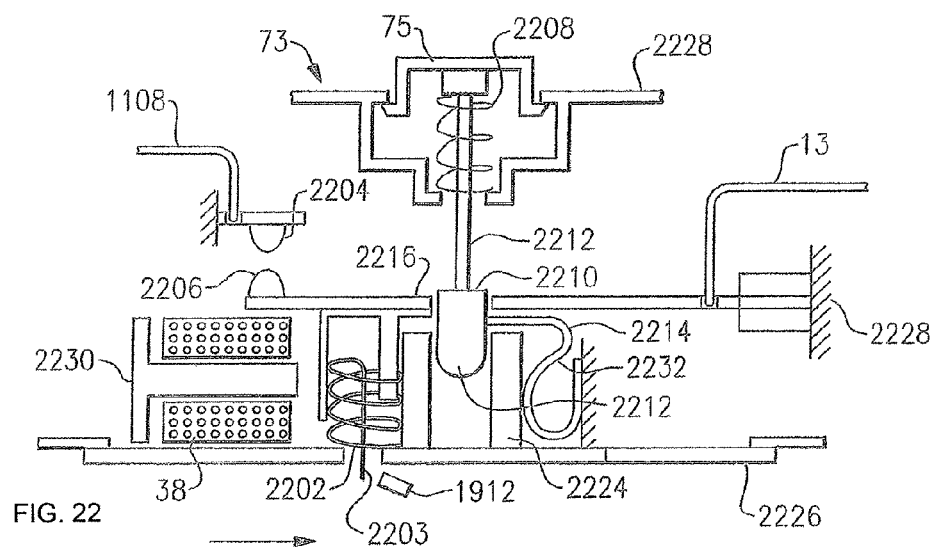
FIG. 22 shows the mechanism of FIG. 21 in the tripped state.

FIG. 22 shows the mechanism of FIG. 21 in the tripped state. The tripped state occurs when SCR 24 activates a magnetic field in solenoid 38, which in turn causes plunger 2230 to displace reset latch 2214 such that the reset button tip 2222 disengages from the latch 2214. The displacement of the reset latch 2214 releases the contact armature 2216 to thereby open contacts 2204 and 2206; the power to the load is thus disconnected.

Resetting is accomplished by applying a downward force on the user accessible reset button 75. When downward force is applied, escapement 2210 is reinserted through hole 2218 in latch 2214. Latch 2214 moves opposite to the direction shown. When downward force is removed, escapement 2210 is re-aligned to lift armature 2216 as has been described. Thus, resetting device 10 is accomplished by momentarily applying force to reset button 75.

Figure 23:
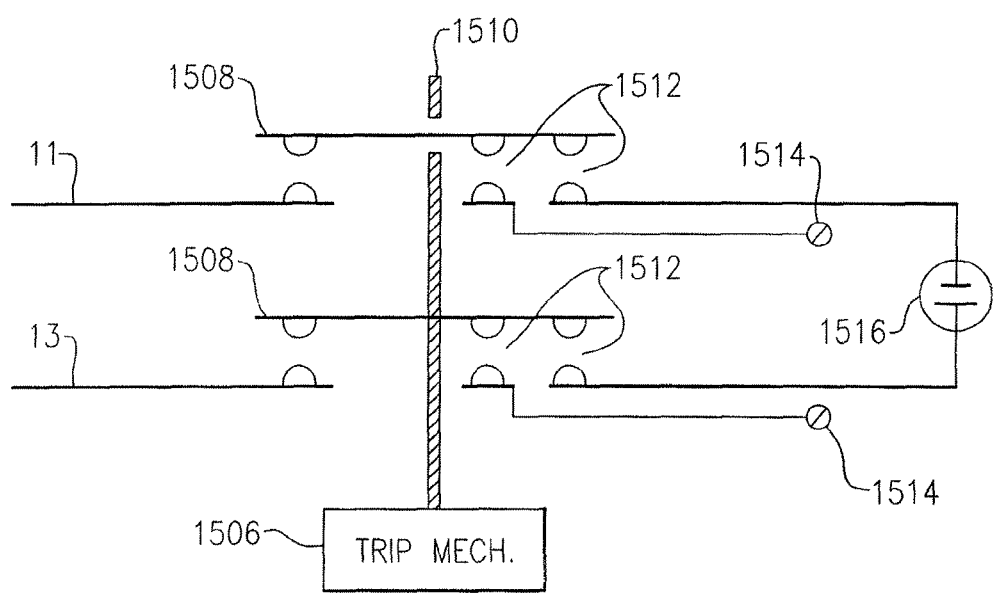
FIG. 23 is a detail view of a circuit interrupter in accordance with another embodiment of the present invention.

The principles shown in FIGS. 21-22 are adaptable to any number of mechanical configurations including the four-pole embodiment depicted in FIG. 23.

FIG. 22 also demonstrates a second mode of tripping of trip mechanism 73 that is not resettable after an end-of-life condition has occurred. The protective device (such as GFI 102) has failed in some manner so as to be non-responsive to a predetermined condition. Power denial mechanism 2200 includes circuitry that operates in a similar manner to circuitry in mechanism 1910 when there is an end-of-life condition. Resistor 1912, no longer restrained by the solder or in an alternative embodiment by an adhesive, is physically dislodged by the bias of lockout spring 2202. Lockout spring 2202 includes a surface 2203 that permanently displaces latch 2214 in the direction shown. Latch 2214 cannot be aligned to the escapement 2210 even if reset button 73 is actuated. Thus, the displacement of resistor 1912 serves to permanently trip the trip mechanism. The permanent disconnection of the load terminals from the line terminals requires that the device be replaced.

Referring to FIG. 23, an alternate circuit interrupter is described. The circuit interrupter includes trip mechanism 1506, interrupting contacts 1508 and reset button 1510 that are similar to previously described element designated as reference elements 73, 74 and 75. The circuit interrupter is coupled to line conductors 11 and 13 and is configured to decouple one or more loads from the utility source when a true fault condition or a simulated fault condition has been detected, or when an automated self-test signal has failed. In particular, when decoupling occurs there is a plurality of air gaps 1512 that serve to electrically isolate a plurality of load structures from one another. The load may include, for example, feed-through terminals 1514 that are disposed in the protective device. The feed through terminals are configured to connect wires to a subsequent portion of the branch electrical circuit. The portion of the branch circuit, in turn, is protected by the protective device. The load structures can also include at least one user accessible plug receptacle 1516 disposed in the protective device. The plug receptacle is configured to mate with an attachment plug of a user attachable load. Accordingly, the user load is likewise protected by the protective device.

As has been previously described, if the device 10 is inadvertently miswired during installation into the branch electrical circuit, i.e., source voltage is connected to the feed-through terminals 1514, the protective device can be configured so as to only momentarily reset each time resetting is attempted, e.g. each time the reset button 1510 is depressed. Alternatively, the protective device can be configured so that during a miswired condition, the ability to reset the device 10 (1300) is blocked. In either case, air gap(s) 1512 prevent power from the utility source at feed-through terminals 1514 from powering plug receptacle(s) 1516. At least one air gap 1512 can be provided for each utility source hot conductor. The user is protected from a fault condition in the user attachable load. Alternatively, at least one air gap 1512 can be provided but in a single utility source conductor. Power to receptacle 1516 would be denied. Therefore the user would be motivated to remedy the miswired condition before a fault condition is likely to arise. In yet another alternative, utility source conductors may selectively include air gaps 1512 for electrically decoupling the load structures.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

What is claimed is:

1. An electrical wiring device comprising:
    a plurality of line terminals and a plurality of load terminals;
    a test circuit coupled to the plurality of line terminals or the plurality of load terminals and configured to generate a recurring simulated fault signal, the recurring simulated fault signal being automatically provided in accordance with a predetermined test regimen;
    a detection circuit coupled to the plurality of line terminals, the detection circuit being configured to generate a test detection signal in response to the recurring simulated fault signal;
    a control system including,
        an end-of-life monitor circuit coupled to the detection circuit, the end-of-life monitor circuit being configured to detect the test detection signal within a test detection monitoring interval and determine that an end-of-life condition has occurred if the test detection signal is not detected within the test detection monitoring interval;
        a control circuit coupled to the end-of-life monitor circuit responsive to at least one failure condition in the end-of-life monitor circuit that prevents the end-of-life monitor circuit from being able to detect the end-of-life condition, the control circuit exhibiting a power denial state in response to the at least one failure condition or the end-of-life condition; and
    a response mechanism coupled to the control circuit, the response mechanism being configured to decouple or prevent the coupling of the plurality of line terminals and the plurality of load terminals when the control circuit exhibits the power denial state.

2. The device of claim 1, wherein the response mechanism permanently decouples the plurality of line terminals from the plurality of load terminals.

3. The device of claim 1, further comprising a plurality of sensors coupled to the plurality of line terminals and the detection circuit, the plurality of line terminals being coupled to a hot line conductor and a neutral line conductor, the plurality of sensors including a first sensor coupled to the neutral line conductor, the plurality of sensors also including at least one second toroidal sensor configured so that the hot line conductor and the neutral line conductor pass through a central opening of the at least one second toroidal sensor.

4. The device of claim 3, wherein the first sensor includes a toroidal sensor portion configured so that only one of the hot line conductor or the neutral line conductor pass through a center opening of the toroidal sensor portion.

5. The device of claim 1, further comprising at least one indicator coupled to the control circuit arrangement, the at least one indicator being configured to emit an indication signal in response to the end-of-life condition.

6. The device of claim 5, wherein the response mechanism decouples the plurality of line terminals from the plurality of load terminals a predetermined period of time after the at least one indicator has emitted the indication.

7. The device of claim 1, wherein the response mechanism further includes a circuit interrupting assembly that is driven into the reset state by a user stimulus, the response mechanism being configured to prevent the user stimulus from maintaining or effecting the reset state.

8. The device of claim 1, wherein the response mechanism further includes a power denial mechanism configured to permanently decouple the plurality of line terminals from the plurality of load when the end-of-life condition occurs.

9. The device of claim 8, wherein the response mechanism is activated when at least one electronic component reaches a predetermined temperature.

10. The device of claim 1, wherein the response mechanism is configured to decouple, or prevent the coupling, of the plurality of line terminals and the plurality of load terminals when the detection circuit is operating to detect at least one fault condition.

11. The device of claim 10, wherein the at least one fault condition includes a ground fault, a grounded neutral fault, or an arc fault.

12. The device of claim 10, wherein the response mechanism permanently prevents a latch member from being coupled to a reset button assembly.

13. The device of claim 1, wherein the response mechanism is configured to prevent a latch member from being coupled to a reset button assembly when the reset button assembly is manually activated.

14. The device of claim 1, wherein a portion of the detection circuit and a portion of the control circuit arrangement are combined in the same integrated circuit.

15. The device of claim 1, wherein the control circuit arrangement is disposed in a single integrated circuit device.

16. An electrical wiring device comprising:
a plurality of line terminals including a hot line conductor and a neutral line conductor, and a plurality of load terminals;
a sensor assembly including a first sensor coupled to the neutral line conductor;
a test circuit coupled to the plurality of line terminals or the plurality of load terminals and configured to generate a recurring simulated fault signal, the recurring simulated fault signal being automatically provided in accordance with a predetermined test regimen;
a detection circuit coupled to the sensor assembly, the detection circuit being configured to generate a test detection signal in response to the recurring simulated fault signal;
a control system including,
an end-of-life monitor circuit coupled to the detection circuit, the end-of-life monitor circuit being configured to detect the test detection signal within a test detection monitoring interval and determine that an end-of-life condition has occurred if the test detection signal is not detected within the test detection monitoring interval;
a control circuit coupled to the end-of-life monitor circuit responsive to at least one failure condition in the end-of-life monitor circuit that prevents the end-of-life monitor circuit from being able to detect the end-of-life condition, the control circuit exhibiting a power denial state in response to the at least one failure condition or the end-of-life condition; and
a response mechanism coupled to the control circuit, the response mechanism being configured to decouple or prevent the coupling of the plurality of line terminals and the plurality of load terminals when the control circuit exhibits the power denial state.

17. The device of claim 16, wherein the sensor assembly includes at least one second toroidal sensor configured so that the hot line conductor and the neutral line conductor pass through a central portion of the at least one second toroidal sensor.

18. The device of claim 17, wherein the at least one second toroidal sensor includes a differential current sensor.

19. The device of claim 16, wherein the first sensor includes a toroidal sensor portion configured so that only one of the hot line conductor or the neutral line conductor pass through a center opening of the toroidal sensor portion.

20. The device of claim 16, wherein the response mechanism further includes a circuit interrupting assembly that is driven into the reset state by a user stimulus, the response mechanism being configured to prevent the user stimulus from maintaining the reset state.

21. The device of claim 16, wherein the response mechanism further includes a power denial mechanism configured to permanently decouple the plurality of line terminals from the plurality of load when the end-of-life condition occurs.

22. The device of claim 21, wherein the response mechanism is activated when at least one electronic component reaches a predetermined temperature.

23. The device of claim 16, wherein the response mechanism is configured to decouple, or prevent the coupling, of the plurality of line terminals and the plurality of load terminals when the detection circuit is operating to detect at least one fault condition.

24. The device of claim 16, wherein the response mechanism is configured to prevent a latch member from being coupled to a reset button assembly when the reset button assembly is manually activated.

25. The device of claim 16, wherein a portion of the detection circuit and a portion of the control circuit arrangement are combined in the same integrated circuit.

26. The device of claim 16, wherein the control circuit arrangement is disposed in a single integrated circuit device.

* * * * *

UNITED STATES PATENT AND TRADEMARK OFFICE
CERTIFICATE OF CORRECTION

PATENT NO. : 10,012,718 B2
APPLICATION NO. : 14/684888
DATED : July 3, 2018
INVENTOR(S) : Macbeth et al.

Page 1 of 1

It is certified that error appears in the above-identified patent and that said Letters Patent is hereby corrected as shown below:

Column 24, Line 67, please insert --terminals-- between "load" and "when"
Column 26, Line 30, please insert --terminals-- between "load" and "when"

Signed and Sealed this
Second Day of October, 2018

Andrei Iancu
*Director of the United States Patent and Trademark Office*